United States Patent
Ashihara et al.

(10) Patent No.: US 10,361,084 B2
(45) Date of Patent: Jul. 23, 2019

(54) METHOD OF MANUFACTURING SEMICONDUCTOR DEVICE, SUBSTRATE PROCESSING APPARATUS, RECORDING MEDIUM, AND SUPPLY SYSTEM

(71) Applicant: HITACHI KOKUSAI ELECTRIC INC., Tokyo (JP)

(72) Inventors: Hiroshi Ashihara, Toyama (JP); Kazuhiro Harada, Toyama (JP); Kimihiko Nakatani, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/909,636

(22) Filed: Mar. 1, 2018

(65) Prior Publication Data
US 2018/0190496 A1    Jul. 5, 2018

Related U.S. Application Data

(63) Continuation of application No. PCT/JP2015/075123, filed on Sep. 3, 2015.

(51) Int. Cl.
*H01L 21/28* (2006.01)
*H01L 21/285* (2006.01)
(Continued)

(52) U.S. Cl.
CPC ........ *H01L 21/28088* (2013.01); *C23C 16/34* (2013.01); *C23C 16/45527* (2013.01);
(Continued)

(58) Field of Classification Search
CPC .. C23C 16/4481; C23C 16/4485–4486; C23C 16/45525–45555; H01L 21/0228; H01L 21/02697
See application file for complete search history.

(56) References Cited

U.S. PATENT DOCUMENTS

| | | |
|---|---|---|
| 2001/0054769 A1 | 12/2001 | Raaijmakers et al. |
| 2008/0003838 A1 | 1/2008 | Haukka et al. |

(Continued)

FOREIGN PATENT DOCUMENTS

| | | |
|---|---|---|
| JP | 05-267220 A | 10/1993 |
| JP | 07-066143 A | 3/1995 |

(Continued)

OTHER PUBLICATIONS

International Search Report dated Oct. 20, 2015 of PCT International Application No. PCT/JP2015/075123.

(Continued)

*Primary Examiner* — Syed I Gheyas
(74) *Attorney, Agent, or Firm* — Volpe and Koenig, P.C.

(57) ABSTRACT

A method of manufacturing a semiconductor device, includes: forming a film on a substrate by performing a cycle a predetermined number of times, the cycle including: supplying two or more kinds of halogen-based precursors having the same major elements and different halogen elements, or different major elements and the same halogen elements, or different major elements and different halogen elements to the substrate while overlapping at least portions of supply periods of the two or more kinds of halogen-based precursors; and supplying a reactant having a chemical structure different from chemical structures of the two or more kinds of halogen-based precursors to the substrate.

20 Claims, 12 Drawing Sheets

(51) Int. Cl.
    *C23C 16/34*     (2006.01)
    *C23C 16/455*    (2006.01)
    *H01L 29/49*     (2006.01)

(52) U.S. Cl.
    CPC ...... *C23C 16/45546* (2013.01); *H01L 21/285* (2013.01); *H01L 21/28556* (2013.01); *H01L 29/4966* (2013.01)

(56) References Cited

U.S. PATENT DOCUMENTS

| | | |
|---|---|---|
| 2009/0325372 A1 | 12/2009 | Harada |
| 2011/0076857 A1 | 3/2011 | Akae et al. |
| 2012/0149193 A1 | 6/2012 | Fujiwara |
| 2012/0269962 A1 | 10/2012 | Blomberg et al. |

FOREIGN PATENT DOCUMENTS

| | | | |
|---|---|---|---|
| JP | 2002-543589 A | | 12/2002 |
| JP | 2008-502805 A | | 1/2008 |
| JP | 2010-034511 A | | 2/2010 |
| JP | 2011-097017 A | | 5/2011 |
| JP | 2011-132568 A | | 7/2011 |
| JP | 2012-124322 A | | 6/2012 |
| JP | 2012-231155 A | | 11/2012 |
| JP | 2013-508552 A | | 3/2013 |
| JP | 2013-151722 A | | 8/2013 |
| WO | 00/65649 A1 | | 11/2000 |

OTHER PUBLICATIONS

Japanese Office Action dated Oct. 2, 2018 for the Japanese Patent Application No. 2017-537165.

METHOD OF MANUFACTURING SEMICONDUCTOR DEVICE, SUBSTRATE PROCESSING APPARATUS, RECORDING MEDIUM, AND SUPPLY SYSTEM

CROSS-REFERENCE TO RELATED APPLICATION

This application is a Bypass Continuation Application of PCT International Application No. PCT/JP2015/075123, filed Sep. 3, 2015, the disclosure of which is incorporated herein in its entirety by reference.

TECHNICAL FIELD

The present disclosure relates to a method of manufacturing a semiconductor device, a substrate processing apparatus, a recording medium, and a supply system.

BACKGROUND

As an example of processes of manufacturing a semiconductor device, a process of forming a film on a substrate is often carried out by supplying a precursor or a reactant to the substrate in the related art.

SUMMARY

Some embodiments of the present disclosure provide a technique capable of improving a quality or the like of a film formed on a substrate.

According to one embodiment of the present disclosure, there is provided a technique including: forming a film on a substrate by performing a cycle a predetermined number of times, the cycle including: supplying two or more kinds of halogen-based precursors having the same major elements and different halogen elements, or different major elements and the same halogen elements, or different major elements and different halogen elements to the substrate while overlapping at least portions of supply periods of the two or more kinds of halogen-based precursors; and supplying a reactant having a chemical structure different from chemical structures of the two or more kinds of halogen-based precursors to the substrate

DETAILED DESCRIPTION

<An Embodiment of the Present Disclosure>

An embodiment of the present disclosure will be described as below with reference to FIGS. 1 to 3.

(1) Configuration of the Substrate Processing Apparatus

Figure 1:
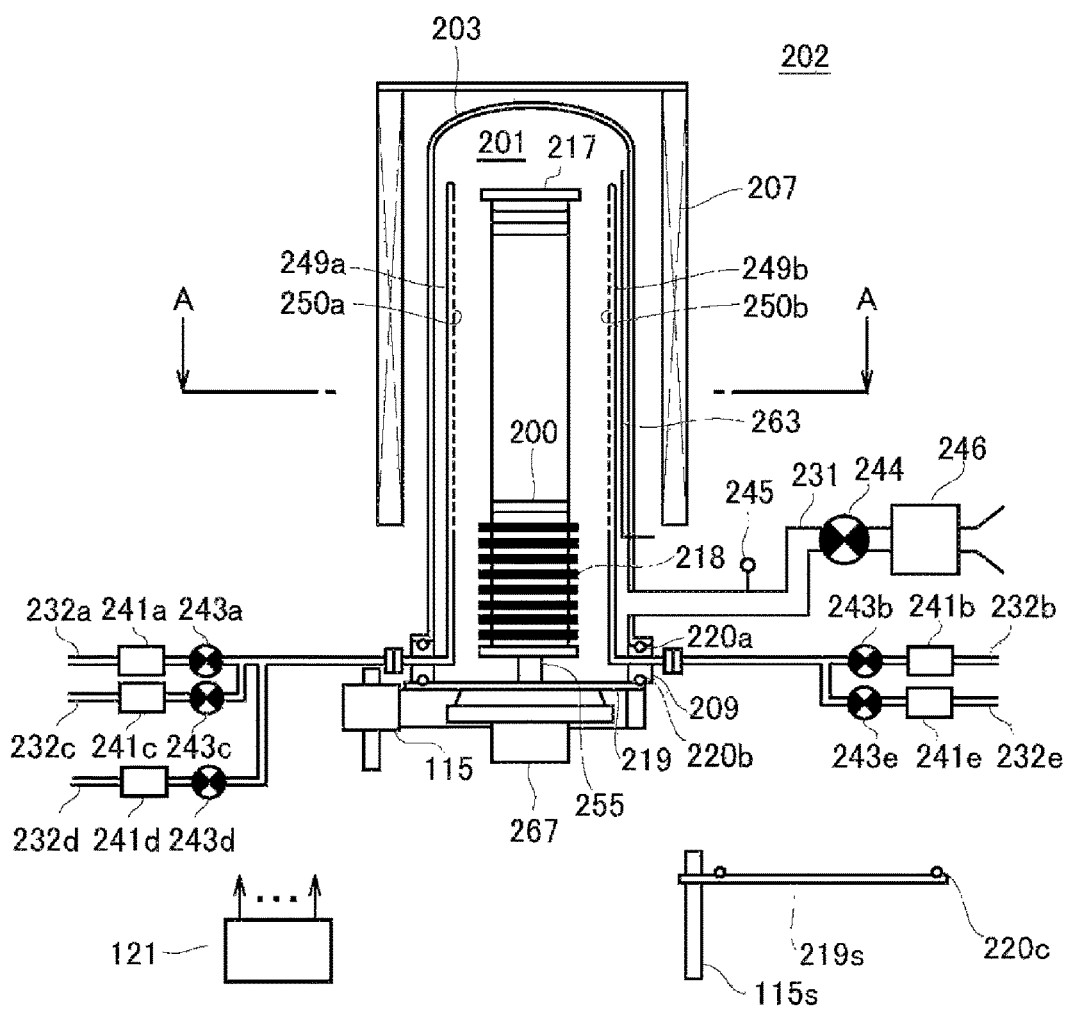
FIG. 1 is a schematic configuration diagram of a vertical type processing furnace of a substrate processing apparatus used in an embodiment of the present disclosure, in which a portion of the processing furnace is shown in a vertical cross sectional view.
Figure 2:
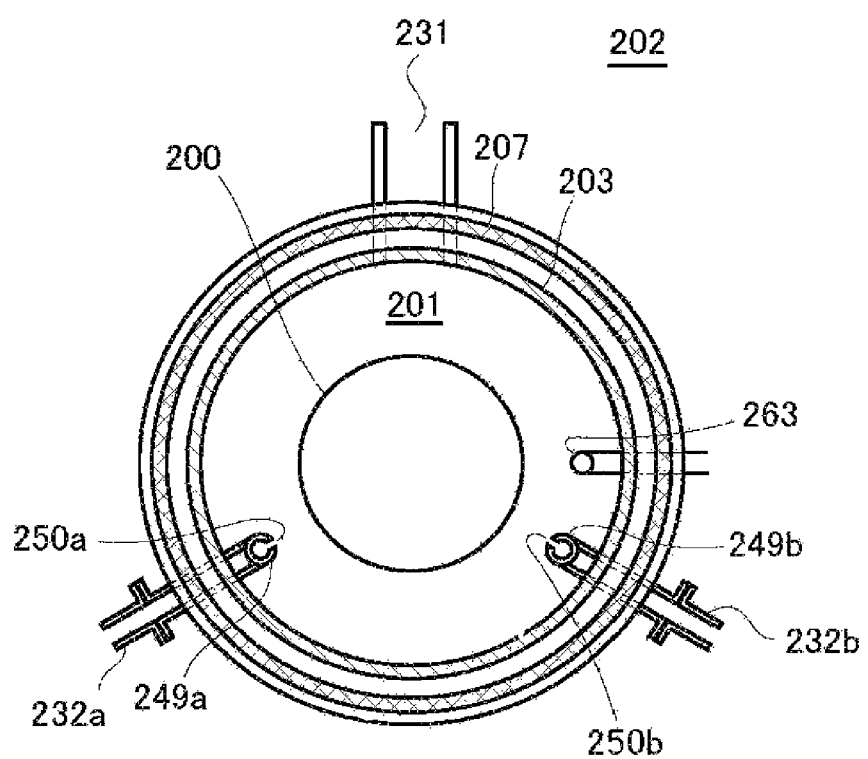
FIG. 2 is a schematic configuration diagram of a portion of the vertical type processing furnace of the substrate processing apparatus used in an embodiment of the present disclosure, in which the portion of the processing furnace is shown in a cross sectional view taken along line A-A in FIG. 1.

As illustrated in FIG. 1, a processing furnace 202 includes a heater 207 as a heating mechanism (temperature adjustment part). The heater 207 has a cylindrical shape and is supported by a heater base (not shown) serving as a holding plate so as to be vertically installed. As will be described below, the heater 207 further functions as an activation mechanism (an excitation part) configured to thermally activate (excite) a gas.

A reaction tube 203 is disposed inside the heater 207 to be concentric with the heater 207. The reaction tube 203 is made of a heat resistant material such as quartz (SiO$_2$), silicon carbide (SiC) or the like and has a cylindrical shape with its upper end closed and its lower end opened. A manifold (inlet flange) 209 is disposed below the reaction tube 203 in a concentric relationship with the reaction tube 203. The manifold 209 is made of metal, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. The manifold 209 is supported by the heater base. Thus, the reaction tube 203 comes into a vertically mounted state. A processing vessel (reaction vessel) is mainly configured by the reaction tube 203 and the manifold 209. A process chamber 201 is formed in a hollow cylindrical portion of the processing vessel. The process chamber 201 is configured to accommodate a plurality of wafers 200 as substrates. The process chamber 201 is configured to accommodate the wafers 200 while the wafers 200 are horizontally arranged in multiple stages along a vertical direction in a boat 217 which will be described below.

Nozzles 249a and 249b are installed in the process chamber 201 so as to penetrate a sidewall of the manifold 209. Gas supply pipes 232a and 232b are respectively connected to the nozzles 249a and 249b. A gas supply pipe 232c is connected to the gas supply pipe 232a. In this way, two nozzles 249a and 249b and three gas supply pipes 232a to 232c are installed in the process vessel (manifold 209) and are capable of supplying plural types of gases into the process chamber 201.

Mass flow controllers (MFCs) 241a to 241c, which are flow rate controllers (flow rate control parts), and valves 243a to 243c, which are opening/closing valves, are sequentially installed in the gas supply pipes 232a to 232c from an upstream side, respectively. Gas supply pipes 232d and 232e, which supply an inert gas, are respectively connected to the gas supply pipes 232a and 232b on the downstream side of the valves 243a and 243b. MFCs 241d and 241e, which are flow rate controllers (flow rate control parts), and valves 243d and 243e, which are opening/closing valves are sequentially installed in the gas supply pipes 232d and 232e from an upstream side, respectively.

The nozzles 249a and 249b are connected to front end portions of the gas supply pipes 232a and 232b respectively. As illustrated in FIG. 2, the nozzles 249a and 249b are respectively disposed in a space with an annular plan-view shape between an inner wall of the reaction tube 203 and the wafers 200 such that the nozzles 249a and 249b extend upward along a stacking direction of the wafers 200 from a lower portion to an upper portion of the inner wall of the reaction tube 203. In other words, the nozzles 249a and 249b are respectively installed at a lateral side of a wafer arrangement region in which the wafers 200 are arranged, namely in a region which horizontally surrounds the wafer arrangement region, so as to extend along the wafer arrangement region. That is, the nozzles 249a and 249b are respectively installed in a perpendicular relationship with the surfaces (flat surfaces) of the wafers 200 at a lateral side of the end portions (peripheral edge portions) of the wafers 200 which are carried into the process chamber 201. The nozzles 249a and 249b are respectively configured as L-shaped long nozzles. A horizontal portion of each of the nozzles 249a and 249b is installed to penetrate a sidewall of the manifold 209. A vertical portion of each of the nozzles 249a and 249b is installed to extend upward at least from one end portion toward the other end portion of the wafer arrangement region. Gas supply holes 250a and 250b for supplying a gas are formed on the side surfaces of the nozzles 249a and 249b respectively. The gas supply holes 250a and 250b are opened toward the center of the reaction tube 203 so as to allow a gas to be supplied toward the wafers 200. The gas supply holes 250a and 250b may be formed in a plural number between a lower portion of the reaction tube 203 and an upper portion of the reaction tube 203. The respective gas supply holes 250a and 250b may have the same aperture area and may be formed at the same aperture pitch.

As described above, in the present embodiment, a gas is transferred via the nozzles 249a and 249b, which are disposed in a vertically-elongated space with an annular plan-view shape, i.e., a cylindrical space, defined by an inner wall of a side wall of the reaction tube 203 and the end portions (peripheral edge portions) of the plurality of wafers 200 arranged within the reaction tube 203. The gas is initially injected into the reaction tube 203, near the wafers 200, through the gas supply holes 250a and 250b respectively opened toward the nozzles 249a and 249b. Accordingly, the gas supplied into the reaction tube 203 mainly flows in the reaction tube 203 in a direction parallel to surfaces of the wafers 200, i.e., in a horizontal direction. With this configuration, the gas can be uniformly supplied to the respective wafers 200. This makes it possible to improve the uniformity in the thickness of a film formed on each of the wafers 200. In addition, the gas flowing on the surfaces of the wafers 200 after the reaction, i.e., residual gas after the reaction, flows toward an exhaust port, i.e., an exhaust pipe 231 which will be described later. The flow direction of the residual gas is not limited to a vertical direction but may be appropriately decided depending on a position of the exhaust port.

A halogen-based precursor (a first precursor, hereinafter simply referred to as a precursor), for example, a halogen-based titanium precursor gas which contains titanium (Ti) as a major element and a halogen element, is supplied from the gas supply pipe 232a into the process chamber 201 via the MFC 241a, the valve 243a and the nozzle 249a.

The precursor gas refers to a gaseous precursor, for example, a gas precursor which remains in a gas state under a room temperature and an atmospheric pressure, a gas obtained by vaporizing a liquid precursor which remains in a liquid state under a room temperature and an atmospheric pressure, a gas obtained by sublimating a solid precursor which remains in a solid state under a room temperature and an atmospheric pressure, or a gas obtained by vaporizing a solution obtained by dissolving the solid precursor in a solvent. The halogen-based precursor is a precursor having a halogen group. The halogen group includes a chloro group, a fluoro group, a bromo group, an iodo group, and the like. That is, the halogen group contains a halogen element such as chlorine (Cl), fluorine (F), bromine (Br), iodine (I) or the like. The halogen-based precursor may be said to be a kind of halide. When the term "precursor" is used herein, it may refer to "a gas precursor (precursor gas) staying in a gaseous state," "a liquid precursor staying in a liquid state," "a solid precursor staying in a solid state," or all of them. When the term "liquid precursor" is used herein, it may refer to a precursor which remains in a liquid state under a room temperature and an atmospheric pressure, a precursor obtained by dissolving a precursor which remains in a solid state under a room temperature and an atmospheric pressure in the form of powder in a solvent and liquefying it, or both of them.

As the halogen-based titanium precursor gas, it may be possible to use, for example, a precursor gas containing Ti and Cl, i.e., a chlorotitanium precursor gas. The chlorotitanium precursor gas acts as a Ti source in a film forming process which will be described later. As the chlorotitanium precursor gas, it may be possible to use tetrachlorotitanium, i.e., a titanium tetrachloride ($TiCl_4$) gas.

A halogen-based precursor (a second precursor, hereinafter simply referred to as a precursor), for example, a halogen-based titanium precursor gas which contains Ti as a major element and a halogen element, is supplied from the gas supply pipe 232c into the process chamber 201 via the WC 241c, the valve 243c, the gas supply pipe 232a and the nozzle 249a.

As the halogen-based titanium precursor gas, it may be possible to use, for example, a precursor gas containing Ti and I, i.e., a titanium iodide precursor gas. The titanium iodide precursor gas acts as a Ti source in the film forming process as described hereinbelow. As the titanium iodide precursor gas, it may be possible to use, for example, tetraiodo titanium, i.e., a titanium tetraiodide ($TiI_4$) gas. The $TiCl_4$ gas and the $TiI_4$ gas may be said to be precursors having the same major elements but different halogen elements.

A reactant having a different chemical structure (molecular structure) from the halogen-based precursor described above, for example, a nitrogen (N)-containing gas, is supplied from the gas supply pipe 232b into the process chamber 201 via the WC 241b, the valve 243b and the nozzle 249b. As the N-containing gas, it may be possible use, for example, a hydrogen-nitride-based gas. The hydrogen-nitride-based gas may also be said to be as a material composed of only two elements, N and H, and acts as a nitriding gas, i.e., an N source, in the film forming process as described hereinbelow. As the hydrogen-nitride-based gas, it may be possible to use, for example, an ammonia ($NH_3$) gas.

A reducing agent is supplied from the gas supply pipe 232b into the process chamber 201 via the WC 241b, the valve 243b, and the nozzle 249b. As the reducing gas, it may be possible to use, for example, an H-containing gas such as an $NH_3$ gas, a diborane ($B_2H_6$) gas, a silane ($SiH_4$) gas, a hydrogen ($H_2$) gas or the like.

An inert gas, for example, a nitrogen ($N_2$) gas, is supplied from the gas supply pipes 232d and 232e into the process chamber 201 via the MFCs 241d and 241e, the valves 243d and 243e, the gas supply pipes 232a and 232b, and the nozzles 249a and 249b.

In the case where the aforementioned precursor is supplied from the gas supply pipes 232a and 232c, a precursor supply system as a first supply system mainly includes the gas supply pipes 232a and 232c, the MFCs 241a and 241c, and the valves 243a and 243c. The nozzle 249a may be regarded as being included in the precursor supply system. The precursor supply system may be referred to as a precursor gas supply system. In the case where the aforementioned halogen-based precursor is supplied as the precursor, the precursor supply system may be referred to as a halogen-based precursor supply system or a halogen-based precursor gas supply system.

In the case where the aforementioned reactant is supplied from the gas supply pipe 232b, a reactant supply system as a second supply system mainly includes the gas supply pipe 232b, the MFC 241b and the valve 243b. The nozzle 249b may be regarded as being included in the reactant supply system. The reactant supply system may be referred to as a reaction gas supply system. In the case where the aforementioned N-containing gas is used as the reactant, the reactant supply system may be referred to as an N-containing gas supply system, a nitriding gas supply system, or a nitriding agent supply system. In the case where the hydrogen-nitride-based gas is supplied as the reactant, the reactant supply system may also be referred to as a hydrogen-nitride-based gas supply system or a hydrogen nitride supply system.

In the case where the aforementioned reducing agent is supplied from the gas supply pipe 232b, a reducing agent system as a third supply system mainly includes the gas supply pipe 232b, the MFC 241b, and the valve 243b. The nozzle 249b may be regarded as being included in the reducing agent supply system. The reducing agent supply system may be referred to as a reducing gas supply system or an H-containing gas supply system.

Furthermore, an inert gas supply system mainly includes the gas supply pipes 232d and 232e, the MFCs 241d and 241e, and the valves 243d and 243e.

A supply system mainly includes the first supply system and the second supply system. The third supply system and the inert gas supply system may be regarded as being included in the supply system.

An exhaust pipe 231 configured to exhaust the internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is a valve configured so as to perform vacuum exhaust of the interior of the process chamber 201 and to stop the vacuum exhaust by opening and closing the APC valve 243 while operating the vacuum pump 246. Further, the internal pressure of the process chamber 201 can be adjusted by adjusting an opening degree of the APC valve 243 based on the pressure information detected by the pressure sensor 245 while operating the vacuum pump 246. An exhaust system mainly includes the exhaust pipe 231, the APC valve 244 and the pressure sensor 245. The vacuum pump 246 may be regarded as being included in the exhaust system.

A seal cap 219, which serves as a furnace opening cover configured to hermetically seal a lower end opening of the manifold 209, is installed under the manifold 209. The seal cap 219 is configured to make contact with a lower end of the manifold 209 from a lower side in the vertical direction. For example, the seal cap 219 is made of metal such as SUS, and is formed in a disc shape. An O-ring 220b, which is a seal member making contact with the lower end of the manifold 209, is installed on an upper surface of the seal cap 219. A rotation mechanism 267 configured to rotate a boat 217, which will be described later, is installed at the opposite side of the seal cap 219 from the process chamber 201. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. The boat elevator 115 is configured as a transfer device (transfer mechanism) which transfers the boat 217, i.e., the wafers 200, into and out of the process chamber 201. Furthermore, a shutter 219s as a furnace opening cover capable of hermetically seal the lower end opening of the manifold 209 while moving the seal cap 219 down with the boat elevator 115 is installed under the manifold 209. For example, the shutter 219s is made of metal such as SUS, and is formed in a disc shape. An O-ring 220c as a seal member making contact with the lower end of the manifold 209 is installed on an upper surface of the shutter 219s. An opening/closing operation (an up-down movement operation or a rotational movement operation) of the shutter 219s is controlled by a shutter opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages. With this configuration, it is hard for heat generated from the heater 207 to be transferred to the seal cap 219. However, the present embodiment is not limited to this configuration. For example, instead of installing the heat insulating plates 218 below the boat 217, a heat insulating tube as a tubular member made of a heat resistant material such as quartz or SiC may be installed under the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a and 249b, the temperature sensor 263 is formed in an L shape. The temperature sensor 263 is installed along the inner wall of the reaction tube 203.

Figure 3:
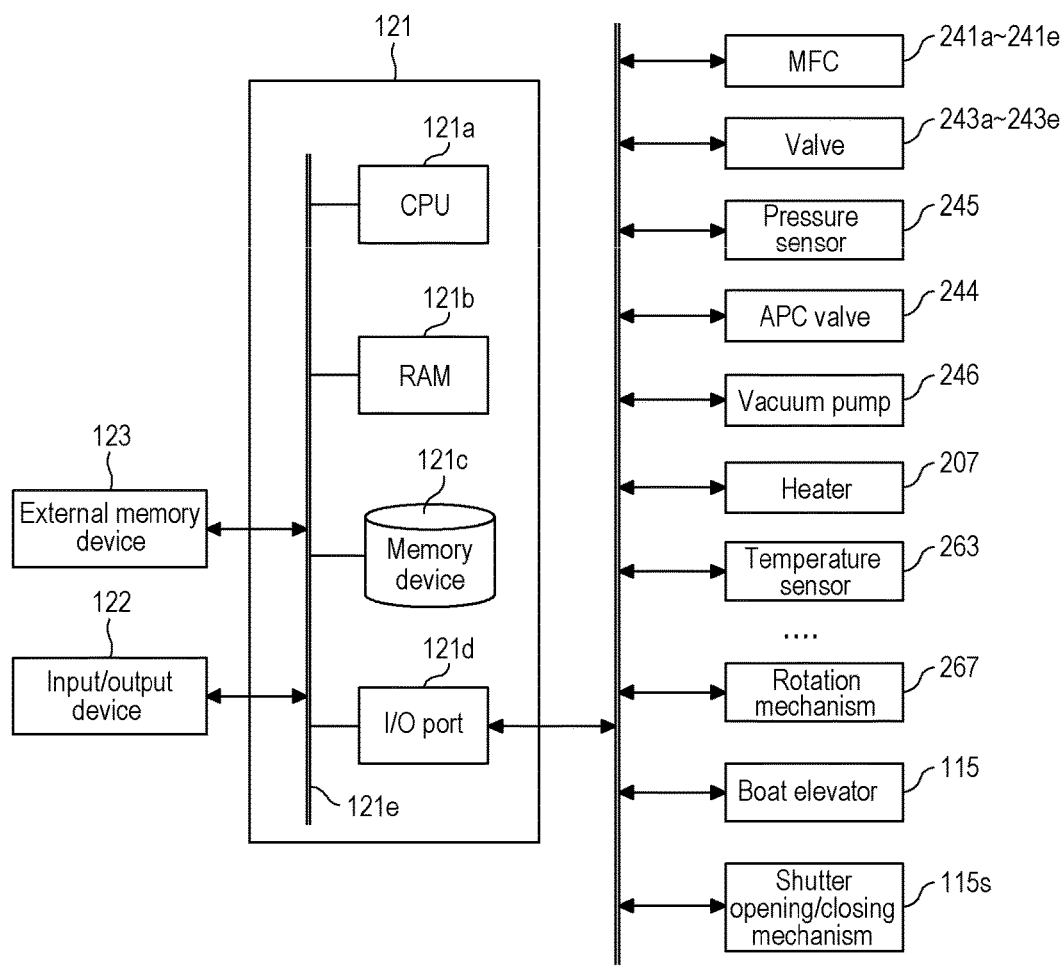
FIG. 3 is a schematic configuration diagram of a controller of the substrate processing apparatus used in an embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 including, e.g., a touch panel or the like, is connected to the controller 121.

The memory device 121c includes, for example, a flash memory, a hard disk drive (HDD), or the like. A control program for controlling operations of a substrate processing apparatus, a process recipe for specifying sequences and conditions of substrate processing as described hereinbelow, or the like is readably stored in the memory device 121c. The process recipe functions as a program for causing the controller 121 to execute each sequence in a film formation process, as described hereinbelow, to obtain a predetermined result. Hereinafter, the process recipe and the control program will be generally and simply referred to as a "program". Furthermore, the process recipe will be simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241e, the valves 243a to 243e, the pressure sensor 245, the APC valve 244, the vacuum pump 246, the temperature sensor 263, the heater 207, the rotation mechanism 267, the boat elevator 115, the shutter opening/closing mechanism 115s, and the like, as mentioned above.

The CPU 121a is configured to read the control program from the memory device 121c and execute the same. The CPU 121a is further configured to read the recipe from the memory device 121c according to an input or the like of an operation command from the input/output device 122. In addition, the CPU 121a is configured to control, according to the contents of the recipe thus read, a flow rate adjusting operation of various kinds of gases by the MFCs 241a to 241e, an opening/closing operation of the valves 243a to 243e, an opening/closing operation of the APC valve 244, a pressure regulating operation performed by the APC valve 244 based on the pressure sensor 245, a driving/stopping operation of the vacuum pump 246, a temperature adjusting operation performed by the heater 207 based on the temperature sensor 263, operations of rotating the boat 217 with the rotation mechanism 267 and adjusting a rotation speed of the boat 217, an operation of moving the boat 217 up and down with the boat elevator 115, an operation of opening and closing the shutter 219s with the shutter opening/closing mechanism 115s, and the like.

The controller 121 may be configured by installing, on the computer, the aforementioned program stored in an external memory device 123 (for example, a magnetic tape, a magnetic disk such as a flexible disk or a hard disk, an optical disc such as a CD or DVD, a magneto-optical disc such as an MO, or a semiconductor memory such as a USB memory or a memory card). The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Film Formation Process

A sequence example of forming a film on a substrate using the aforementioned substrate processing apparatus, which is one of the processes for manufacturing a semiconductor device, will be described below with reference to FIG. 4A. In the following descriptions, operations of respective parts constituting the substrate processing apparatus are controlled by the controller 121.

Figure 4A:
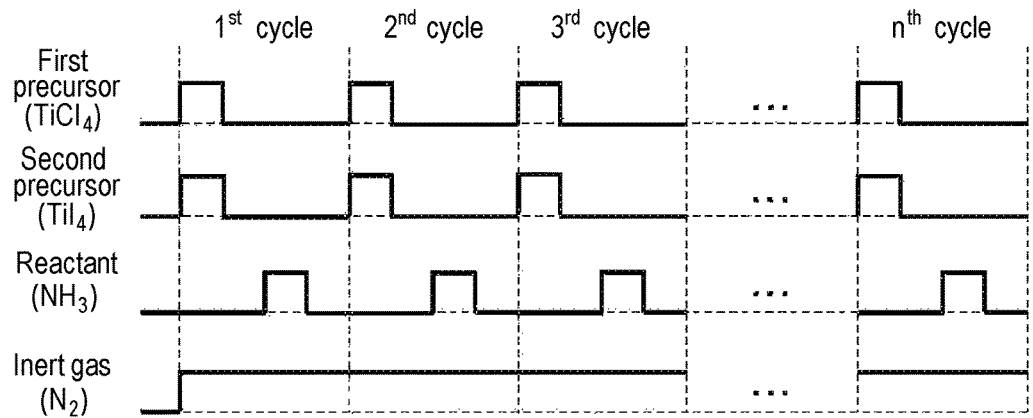
FIG. 4A is a diagram illustrating a film forming sequence according to one embodiment of the present disclosure.

In the film formation sequence illustrated in FIG. 4A, a titanium nitride film (TiN film) as a film containing Ti and N is formed on the wafer 200 by performing a cycle a predetermined number of times (more than once), the cycle including: a step 1 of supplying a $TiCl_4$ gas and a $TiI_4$ gas as two or more kinds of halogen-based precursors having the same major elements and different halogen elements, different major elements and the same halogen elements, or different major elements and different halogen elements to a wafer 200 as a substrate while overlapping at least portions of supply periods of the $TiCl_4$ gas and the $TiI_4$ gas; and a step 2 of supplying an $NH_3$ gas as a reactant having a chemical structure different from that of the two or more kinds of halogen-based precursors to the wafer 200.

In the present disclosure, for the sake of convenience, the film forming sequence illustrated in FIG. 4A may sometimes be denoted as follows. The same denotation will be used in the modifications and other embodiments as described hereinbelow.

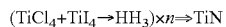

$(TiCl_4 + TiI_4 \rightarrow HH_3) \times n \Rightarrow TiN$

When the term "wafer" is used herein, it may refer to "a wafer itself" or "a laminated body (aggregate) of a wafer and a predetermined layer or film formed on the surface of the wafer". That is, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body".

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer."

(Substrate Preparing Step)

If a plurality of wafers 200 is charged on the boat 217 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment Step)

The interior of the process chamber 201, namely a space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The vacuum pump 246 is normally activated at least during a time period before the film forming process as described below is completed. The wafers 200 in the process chamber 201 are heated by the heater 207 to a desired film-forming temperature. In this operation, the state of supplying electric power to the heater 207 is feedback-controlled based on the temperature information detected by the temperature sensor 263 such that the interior of the process chamber 201 has a desired temperature distribution. In addition, the interior of the process chamber 201 is heated by the heater 207 continuously at least during a time period before the film forming process as described below is completed. The rotation of the boat 217 and the wafers 200 by the rotation mechanism 267 begins. The boat 217 and the wafers 200 are rotated by the rotation mechanism 267 continuously at least during a time period before the film formation process as described below is completed.

(Film Forming Step)

Subsequently, the following two steps, i.e., steps 1 and 2, are sequentially performed.

[Step 1]

In this step, a $TiCl_4$ gas and a $TiI_4$ gas are supplied to the wafer 200 accommodated within the process chamber 201 while at least portions of their supply periods are overlapped. The film forming sequence illustrated in FIG. 4A illustrates a case where a $TiCl_4$ gas and a $TiI_4$ gas are supplied by overlapping all of their supply periods. That is, the supply of the $TiCl_4$ gas to the wafer 200 and the supply of the $TiI_4$ gas to the wafer 200 is simultaneously started, and thereafter, the supply of the $TiCl_4$ gas to the wafer 200 and the supply of the $TiI_4$ gas to the wafer 200 are simultaneously stopped.

Specifically, the valves 243a and 243c are simultaneously opened to allow a $TiCl_4$ gas to flow through the gas supply pipe 232a and a $TiI_4$ gas to flow through the gas supply pipe 232c, respectively. The flow rates of the $TiCl_4$ gas and the $TiI_4$ gas are respectively adjusted by the MFCs 241a and 241c. The $TiCl_4$ gas and the $TiI_4$ gas are mixed (pre-mixed) with each other in the gas supply pipe 232a and the nozzle 249a, are supplied into the process chamber 201 in a uniformly mixed state and are exhausted from the exhaust pipe 231. At this time, a mixture gas of the $TiCl_4$ gas and the $TiI_4$ gas is supplied to the wafer 200. Simultaneously, the valve 243d is opened to allow an $N_2$ gas to flow through the gas supply pipe 232d. The flow rate of the $N_2$ gas is adjusted by the MFC 241d. The $N_2$ gas is supplied into the process chamber 201 together with the $TiCl_4$ gas and the $TiI_4$ gas and is exhausted from the exhaust pipe 231.

Furthermore, in order to prevent the $TiCl_4$ gas and the $TiI_4$ gas from entering the nozzle 249b, the valve 243e is opened to allow the $N_2$ gas to flow through the gas supply pipe 232e. The $N_2$ gas is supplied into the process chamber 201 via the gas supply pipe 232b and the nozzle 249b and is exhausted from the exhaust pipe 231.

At this time, the internal pressure of the process chamber 201 may be set at a pressure which falls within a range of, for example, 10 to 2,000 Pa, by appropriately adjusting the APC valve 244. The supply flow rate of the $TiCl_4$ gas controlled by the MFC 241a and the supply flow rate of the $TiI_4$ gas controlled by the MFC 241c may be respectively set at a flow rate which falls within a range of, for example, 10 to 2,000 sccm. The supply flow rates of the $N_2$ gas controlled by the MFCs 241d and 241e may be respectively set at a flow rate which falls within a range of, for example, 100 to 10,000 sccm. The time period, during which the mixture gas of the TiCl$_4$ gas and the TiI$_4$ gas is supplied to the wafer 200, may be set at a time period which falls within a range of, for example, 0.1 to 120 seconds. The temperature of the heater 207 is set such that the temperature of the wafer 200 becomes a temperature which falls within a range of, for example, 200 to 450 degrees C.

If the temperature of the wafer 200 is lower than 200 degrees C., there may be a case where a first layer (Ti-containing layer containing Cl and I), which will be described later, formed at step 1 and an NH$_3$ gas supplied at step 2 do not react, and a second layer (TiN layer) is not formed at step 2. This problem can be solved by setting the temperature of the wafer 200 to become 200 degrees C. or higher. Furthermore, if the temperature of the wafer 200 exceeds 450 degrees C., an excessive gas phase reaction may occur. Thus, the film thickness uniformity is likely to be deteriorated and the control of the film thickness uniformity is difficult. By setting the temperature of the wafer 200 at 450 degrees C. or lower, it is possible to suppress the deterioration of the film thickness uniformity while generating a moderate gas phase reaction and the control of the film thickness uniformity is possible. Therefore, the temperature of the wafer 200 may be set fall within a range of 200 to 450 degrees C. in some embodiments.

As a result of intensive research by the inventors, it was found that, since both the TiCl$_4$ gas and the TiI$_4$ gas are halogen-based precursors, they do not react with each other at least under the aforementioned conditions and are hardly consumed in the gas phase. Therefore, the TiCl$_4$ gas and the TiI$_4$ gas pre-mixed in the gas supply pipe 232a and in the nozzle 249a are supplied into the process chamber 201, are subsequently diffused in the process chamber 201 while maintaining a constant mixing ratio and are supplied to the wafer 200. At this time, a partial pressure ratio (a partial pressure of the TiCl$_4$ gas/a partial pressure of the TiI$_4$ gas) between the TiCl$_4$ gas and the TiI$_4$ gas in the process chamber 201 is also kept constant. Therefore, in the film forming sequence illustrated in FIG. 4A, a supply ratio of the TiCl$_4$ gas and the TiI$_4$ gas (a supply amount of the TiCl$_4$ gas/a supply amount of the TiI$_4$ gas) to the wafer 200 remains unchanged and constant.

By supplying the TiCl$_4$ gas and the TiI$_4$ gas to the wafer 200 under the aforementioned conditions, a Ti-containing containing Cl or I and having a thickness of, for example, about less than one atomic layer to several atomic layers, is formed as a first layer (initial layer) on the uppermost surface of the wafer 200. The Ti-containing layer containing Cl or I may include a Ti layer containing Cl or I (hereinafter, also referred to simply as a Ti layer), an adsorption layer of TiCl$_4$ or TiI$_4$ (hereinafter, also referred to simply as an adsorption layer of precursor molecules), or both of them. Hereinafter, the Ti-containing layer containing Cl or I may be simply referred to as a Ti-containing layer.

The Ti layer containing Cl or I generally refers to all layers including, in addition to a continuous layer formed of Ti and containing Cl or I, a discontinuous layer and a Ti thin film formed by overlapping these layers and containing Cl or I. The continuous layer formed of Ti and containing Cl or I may also be referred to as a Ti thin film containing Cl or I. Ti constituting the Ti layer containing Cl or I includes, in addition to the one in which a bond with Cl or I is not completely broken, the one in which the bond with Cl or I is completely broken.

The adsorption layer of precursor molecules includes, in addition to a continuous adsorption layer formed of TiCl$_4$ molecules or TiI$_4$ molecules, a discontinuous adsorption layer. That is, the adsorption layer of precursor molecules includes an adsorption layer having a thickness of one molecular layer formed of TiCl$_4$ molecules or TiI$_4$ molecules or a thickness of less than one molecular layer. The TiCl$_4$ molecules or TiI$_4$ molecules constituting the adsorption layer of precursor molecules include a molecule in which a bond of Ti and C is partially broken, or a molecule in which a bond of Ti and I is partially broken. That is, the adsorption layer of precursor molecules may include a physical adsorption layer of TiCl$_4$ or TiI$_4$, a chemisorption layer of TiCl$_4$ or TiI$_4$, or both of them.

In this regard, the layer having a thickness of less than one atomic layer refers to an atomic layer formed discontinuously, and the layer having a thickness of one atomic layer refers to an atomic layer formed continuously. The layer having a thickness of less than one molecular layer refers to a molecular layer formed discontinuously, and the layer having a thickness of one molecular layer refers to a molecular layer formed continuously. The Ti-containing layer containing Cl or I may include both the Ti layer containing Cl or I and the adsorption layer of precursor molecules. However, as described above, the Ti-containing layer containing Cl or I may be expressed as "one atomic layer", "several atomic layers" or the like.

The Ti layer is formed by depositing Ti on the wafer 200 under a condition in which the TiCl$_4$ gas or the TiI$_4$ gas is autolyzed (pyrolyzed). The adsorption layer of precursor molecules is formed by adsorbing TiCl$_4$ or TiI$_4$ on the wafer 200 under a condition in which the TiCl$_4$ gas or the TiI$_4$ gas is not autolyzed (pyrolyzed). It may be more desirable more to form the Ti layer on the wafer 200 than to form the adsorption layer of precursor molecules on the wafer 200 in that the former can increase a deposition rate in some embodiments.

If the thickness of the first layer exceeds several atomic layers, a modifying action at step 2 as described below does not affect the entirety of the first layer. A minimum value of the thickness of the first layer is less than one atomic layer. Accordingly, the thickness of the first layer may be approximately from less than one atomic layer to several atomic layers in some embodiments. By setting the thickness of the first layer at one atomic layer or less, i.e., one atomic layer or less than one atomic layer, it is possible to relatively increase the modifying action at step 2 as described below, and to shorten the time required for the modification at step 2. It is also possible to shorten the time required in forming the first layer at step 1. As a result, it is possible to shorten a processing time per one cycle and to shorten a total processing time. That is, it is also possible to increase a deposition rate. By setting the thickness of the first layer at one atomic layer or less, it is also possible to enhance the controllability of the film thickness uniformity.

After the first layer is formed, the valves 243a and 243c are closed to stop the supply of the TiCl$_4$ gas and the TiI$_4$ gas at the same time. At this time, the interior of the process chamber 201 is vacuum-exhausted by the vacuum pump 246 while opening the APC valve 244. Thus, the unreacted TiCl$_4$ gas and the TiI$_4$ gas, or the TiCl$_4$ gas and the TiI$_4$ gas contributed to the formation of the first layer, which remains within the process chamber 201, are removed from the interior of the process chamber 201. At this time, the supply of the N$_2$ gas into the process chamber 201 is maintained while opening the valves 243d and 243e. The N$_2$ gas acts as a purge gas. This makes it possible to enhance an effect of removing the gas remaining within the process chamber 201, from the interior of the process chamber 201.

At this time, the gas remaining within the process chamber 201 may not be completely removed and the interior of the process chamber 201 may not be completely purged. If the amount of the gas remaining within the process chamber 201 is small, no adverse effect will occur at step 2 to be performed later. In this case, a large flow rate of the $N_2$ gas supplied into the process chamber 201 is not necessary. For example, by supplying the $N_2$ gas of substantially the same amount as a volume of the reaction tube 203 (the process chamber 201), it is possible to perform a purge operation such that an adverse effect is not generated at step 2. By not completely purging the interior of the process chamber 201 in this way, it is possible to shorten the purge time and to improve the throughput. In addition, it is possible to suppress the consumption of the $N_2$ gas to a necessary minimum level.

As the precursor (the first precursor or the second precursor), it may be possible to use, in addition to the $TiCl_4$ gas and the $TiI_4$ gas, a halogen-based titanium precursor gas such as a titanium tetrafluoride ($TiF_4$) gas, a titanium tetrabromide ($TiBr_4$) gas or the like, i.e., a titanium precursor gas containing a halogen element other than Cl or I.

As the precursor, it may also be possible to use, instead of Ti, a halogen-based metal precursor gas containing, as the major element, a metal element such as zirconium (Zr), hafnium (Hf), tantalum (Ta), niobium (Nb), molybdenum (Mo), tungsten (W), yttrium (Y), strontium (Sr), aluminum (Al) or the like.

For example, as the precursor, it may be possible to use a chlorine-based metal precursor gas such as a zirconium tetrachloride ($ZrCl_4$) gas, a hafnium tetrachloride ($HfCl_4$) gas, a tantalum pentachloride ($TaCl_5$) gas, a niobium pentachloride ($NbCl_5$) gas, a molybdenum pentachloride ($MoCl_5$) gas, a tungsten hexachloride ($WCl_6$) gas, a yttrium trichloride ($YCl_3$) gas, a strontium dichloride ($SrCl_2$) gas, an aluminum trichloride ($AlCl_3$) gas or the like.

Furthermore, for example, as the precursor, it may be possible to use a fluorine-based metal precursor gas such as a zirconium tetrafluoride ($ZrF_4$) gas, a hafnium tetrafluoride ($HfF_4$) gas, a tantalum pentafluoride ($TaF_5$) gas, a niobium pentafluoride ($NbF_5$) gas, a molybdenum hexafluoride ($MoF_6$) gas, a tungsten hexafluoride ($WF_6$) gas, a yttrium trifluoride ($YF_3$) gas, a strontium difluoride ($SrF_2$) gas, an aluminum trifluoride ($AlF_3$) gas or the like.

In addition, for example, as the precursor, it may be possible to use a bromine-based metal precursor gas such as a zirconium tetrabromide ($ZrBr_4$) gas, a hafnium tetrabromide ($HfBr_4$) gas, a tantalum pentabromide ($TaBr_5$) gas, a niobium pentabromide ($NbBr_5$) gas, a tungsten hexabromide ($WBr_6$) gas, a yttrium tribromide ($YBr_3$) gas, a strontium dibromide ($SrBr_2$) gas, an aluminum tribromide ($AlBr_3$) gas or the like.

Moreover, for example, as the precursor, it may be possible to use an iodine-based metal precursor gas such as a zirconium tetraiodide ($ZrI_4$) gas, a hafnium tetraiodide ($HfI_4$) gas, a tantalum pentaiodide ($TaI_5$) gas, a niobium pentaiodide ($NbI_5$) gas, a yttrium triiodide ($YI_3$) gas, a strontium diiodide ($SrI_2$) gas, an aluminum triiodide ($AlI_3$) gas or the like.

Further, as the precursor, it may be possible to use a halogen-based semimetal precursor gas containing, as the major element, a semimetal element such as silicon (Si), germanium (Ge), boron (B), antimony (Sb), tellurium (Te) or the like. For example, as the precursor, it may be possible to use a halogen-based silicon precursor gas such as a silicon tetrachloride ($SiCl_4$) gas, a silicon tetrafluoride ($SiF_4$) gas, a silicon tetrabromide ($SiBr_4$) gas, a silicon tetraiodide ($SiI_4$) gas or the like. In addition, for example, as the precursor, it may be possible to use a halogen-based boron precursor gas such as a boron trichloride ($BCl_3$) gas, a boron trifluoride ($BF_3$) gas, a boron tribromide ($BBr_3$) gas, a boron triiodide ($BI_3$) gas or the like.

As the inert gas, it may be possible to use, in addition to the $N_2$ gas, for example, a rare gas such as an Ar gas, an He gas, an Ne gas, a Xe gas or the like.

[Step 2]

After step 1 is completed, an $NH_3$ gas is supplied to the wafer 200 accommodated within the process chamber 201, i.e., to the first layer formed on the wafer 200.

At this step, the valve 243b is opened with the valves 243a and 243c closed. Further, the opening/closing control of the valves 243d and 243e is performed in the same procedure as the opening/closing control of the valves 243d and 243e at step 1. The flow rate of the $NH_3$ gas is adjusted by the MFC 241b. The $NH_3$ gas is supplied into the process chamber 201 via the nozzle 249b and is exhausted from the exhaust pipe 231. At this time, the $NH_3$ gas is supplied into the wafer 200.

The supply flow rate of the $NH_3$ gas controlled by the MFC 241b may be set at a flow rate which falls within a range of, for example, 200 to 10,000 sccm. The internal pressure of the process chamber 201 may be set to fall within a range of, for example, 1 to 5,000 Pa or 1 to 4,000 Pa in some embodiments. By setting the internal pressure of the process chamber 201 to fall within such a relatively high pressure range, it is possible to thermally activate the $NH_3$ gas with non-plasma. Supplying the thermally activated $NH_3$ gas can cause a relatively soft reaction, which facilitates the formation of a second layer (TiN layer) as described below. The time period, during which the $NH_3$ gas is supplied to the wafer 200, may be set to fall within a range of, for example, 1 to 120 seconds or 1 to 60 seconds in some embodiments. Other processing conditions may be similar to, for example, the processing conditions of step 1.

By supplying the $NH_3$ gas to the wafer 200 under the aforementioned conditions, it is possible to nitride (modify) at least a portion of the first layer formed on the wafer 200. That is, at least a portion of the N component contained in the $NH_3$ gas can be added to the first layer to form a Ti—N bond in the first layer. By modifying the first layer, a layer containing Ti and N, i.e., a titanium nitride layer (TiN layer), is formed as the second layer on the wafer 200. When forming the second layer, an impurity such as Cl or I contained in the first layer, which constitutes a gaseous substance containing at least Cl or I in the process of the modifying reaction of the first layer with the $NH_3$ gas, is discharged from the interior of the process chamber 201. That is, the impurity such as Cl or I in the first layer is drawn out or desorbed from the first layer so as to be separated from the first layer. Thus, the second layer becomes a layer having less impurity such as Cl or I than the first layer.

After the second layer is formed, the valve 243b is closed to stop the supply of the $NH_3$ gas. Then, the unreacted $NH_3$ gas, the $NH_3$ gas contributed to the formation of the second layer, or the reaction byproduct, which remains within the process chamber 201, is removed from the interior of the process chamber 201 according to the same processing procedures as those of step 1. At this time, similar to step 1, the gas or the like remaining within the process chamber 201 may not be completely removed.

As the reactant (nitriding gas), it may be possible to use, in addition the $NH_3$ gas, for example, a hydrogen-nitride-based gas such as a diazene ($N_2H_2$) gas, a hydrazine ($N_2H_4$)

gas, an $N_3H_8$ gas or the like. In addition, as the reactant, it may be possible to use, in addition these gases, for example, a gas containing an amine, i.e., an amine-based gas. As the amine-based gas, it may be possible to use a monomethylamine ($CH_3NH_2$, abbreviation: MMA) gas, a dimethylamine (($CH_3$)$_2$NH, abbreviation: DMA) gas, a trimethylamine (($CH_3$)$_3$N, abbreviation: TMA) gas, a monoethylamine ($C_2H_5NH_2$, abbreviation: MEA) gas, a diethylamine (($C_2H_5$)$_2$NH, abbreviation: DEA) gas, a triethylamine (($C_2H_5$)$_3$N, abbreviation: TEA) gas or the like. Furthermore, as the reactant, it may be possible to use a gas containing an organic hydrazine compound, i.e., an organic hydrazine-based gas. As the organic hydrazine-based gas, it may be possible to use a monomethylhydrazine (($CH_3$)$HN_2H_2$, abbreviation: MMH) gas, a dimethylhydrazine (($CH_3$)$_2$$N_2H_2$, abbreviation: DMH), a trimethylhydrazine (($CH_3$)$_2$$N_2$($CH_3$)H, abbreviation: TMH) gas or the like.

As the inert gas, it may be possible to use, in addition to the $N_2$ gas, for example, a rare gas such as an Ar gas, an He gas, an Ne gas, a Xe gas or the like.

(Performing a Predetermined Number of Times)

A cycle which non-simultaneously, i.e., non-synchronously, performs steps 1 and 2 described above is implemented a predetermined number of times (n times). Thus, a TiN film having a predetermined composition and a predetermined thickness can be formed on the wafer 200. The aforementioned cycle may be repeated multiple times. That is, the thickness of the second layer formed per one cycle may be set smaller than a desired thickness and the aforementioned cycle may be repeated multiple times until the thickness of the Ti film formed by laminating the second layer becomes equal to the desired thickness.

(After Purge Step and Atmospheric Pressure Return Step)

After the film forming step is completed, the $N_2$ gas is supplied from each of the gas supply pipes 232d and 232e into the process chamber 201 and is exhausted from the exhaust pipe 231. The $N_2$ gas acts as a purge gas. Thus, the interior of the process chamber 201 is purged, and the gas or the reaction byproduct, which remains within the process chamber 201, is removed from the interior of the process chamber 201 (after purge). Thereafter, the internal atmosphere of the process chamber 201 is substituted by an inert gas (inert gas substitution). The internal pressure of the process chamber 201 is returned to an atmospheric pressure (atmospheric pressure return).

(Unloading Step)

Thereafter, the seal cap 219 is moved down by the boat elevator 115 to open the lower end of the manifold 209. The processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s through the O-ring 220c (shutter closing). The processed wafers 200 are unloaded to the outside of the reaction tube 203 and are subsequently discharged from the boat 217 (wafer discharging).

(3) Effects According to the Present Embodiment

According to the present embodiment, one or more effects as set forth below may be achieved.

(a) By using a combination of two kinds of gases such as the $TiCl_4$ gas and the $TiI_4$ gas as the halogen-based precursors, it is possible to more precisely control a work function of the TiN film in a wide range than the case of using only one kind of gas of the $TiCl_4$ gas or the $TiI_4$ gas.

The reason is because the work function of the TiN film tends to be large when only the $TiCl_4$ gas is used as the halogen-based precursor and small when only the $TiI_4$ gas is used as the halogen-based precursor. The inventors have confirmed that the work function of the TiN film in the case where only the $TiCl_4$ gas is used as the halogen-based precursor is about 4.7 eV and the work function of the TiN film when only the $TiI_4$ gas is used is about 4.4 to 4.5 eV. By using a combination of two kinds of the $TiCl_4$ gas and $TiI_4$ gas as the halogen-based precursors as in this embodiment, it is possible to control the work function of the TiN film to have a desired value which falls within a range of, for example, 4.4 to 4.7 eV.

Specifically, by increasing the supply ratio of the $TiCl_4$ gas to the $TiI_4$ gas (the supply amount of the $TiCl_4$ gas/the supply amount of the $TiI_4$ gas) (the supply amount of the $TiCl_4$ gas>the supply amount of the $TiI_4$ gas) at step 1, it is possible to make the work function of the TiN film close to the work function (4.7 eV) of the TiN film formed by using only the $TiCl_4$ gas as the halogen-based precursor. Further, for example, by decreasing the supply ratio of the $TiCl_4$ gas to the $TiI_4$ gas (the supply amount of the $TiCl_4$ gas<the supply amount of the $TiI_4$ gas) at step 1, it is possible to make the work function of the TiN film close to the work function (4.4 to 4.5 eV) of the TiN film formed by using only the $TiI_4$ gas as the halogen-based precursor.

(b) By using a combination of two kinds of the $TiCl_4$ gas and the $TiI_4$ gas as the halogen-based precursors, it is possible to more precisely control an electric resistance of the TiN film in a wide range compared to the case of using only one kind of gas of the $TiCl_4$ gas and the $TiI_4$ gas.

The reason is because the electric resistance of the TiN film tends to be large when only the $TiCl_4$ gas is used as the halogen-based precursor and small when only the $TiI_4$ gas is used as the halogen-based precursor. By using two kinds of the $TiCl_4$ gas and $TiI_4$ gas as the halogen-based precursors, it is possible to control the electric resistance of the TiN film to have a desired value which is smaller than the electric resistance of the TiN film formed by using only the $TiCl_4$ gas as the halogen-based precursor and larger than the electric resistance of the TiN film formed by using only the $TiI_4$ gas as the halogen-based precursor.

Specifically, by increasing the supply ratio of the $TiCl_4$ gas to the $TiI_4$ gas (the supply amount of the $TiCl_4$ gas/the supply amount of the $TiI_4$ gas) (the supply amount of the $TiCl_4$ gas>the supply amount of the $TiI_4$ gas) at step 1, it is possible to make the electric resistance of the TiN film close to the electric resistance of the TiN film formed by using only the $TiCl_4$ gas as the halogen-based precursor. Further, for example, by decreasing the supply ratio of the $TiCl_4$ gas to the $TiI_4$ gas (the supply amount of the $TiCl_4$ gas<the supply amount of the $TiI_4$ gas) at step 1, it is possible to make the electric resistance of the TiN film close to the electric resistance of the TiN film formed by using only the $TiI_4$ gas as the halogen-based precursor.

In this embodiment, since the supply of the $TiCl_4$ gas and the supply of the $TiI_4$ gas are synchronized, by setting the supply flow rate of the $TiCl_4$ gas>the supply flow rate of the $TiI_4$ gas, it is possible to make the supply amount of the $TiCl_4$ gas>the supply amount of the $TiI_4$ gas. Further, by setting the supply flow rate of the $TiCl_4$ gas<the supply flow rate of the $TiI_4$ gas, it is possible to make the supply amount of the $TiCl_4$ gas<the supply amount of the $TiI_4$ gas.

(c) With the excellent effects described above, the film forming method according to this embodiment may be used in forming a gate electrode by a gate last method. The gate last method is a method in which a recess is formed on a wafer by removing a dummy gate (polysilicon thin film or the like) which is formed in advance in a gate portion of a field effect transistor, and a TiN film or the like is embedded in the recess to form a gate electrode. If the volume of the recess where the gate electrode is to be embedded is reduced according to miniaturization of a processing dimension, it may be difficult to adjust the work function of the gate electrode, or it may be difficult to embed the gate electrode in the recess. On the other hand, according to the method of this embodiment, it is possible to precisely control the work function and electric resistance of the TiN film in a wide range, and to improve embedding characteristics of the TiN film in the recess by using excellent step coverage. From these facts, the method of this embodiment is particularly effective in forming a gate electrode in a fine recess by the gate last method.

(d) By using a combination of two kinds gases such as the $TiCl_4$ gas and the $TiI_4$ gas as the halogen-based precursors, it is possible to reduce the impurity concentration in the TiN film compared with the case of using only the $TiCl_4$ gas. This is because, according to this embodiment using a combination of the $TiCl_4$ gas and the $TiI_4$ gas, it is possible to reduce the total supply amount of the $TiCl_4$ gas to the wafer 200 compared with the case of using only the $TiCl_4$ gas. This makes it possible to reduce the amount of Cl remaining in the TiN film. Further, in this embodiment using a combination of the $TiCl_4$ gas and the $TiI_4$ gas, there is a possibility that Iodine (I) may remain in the first layer in the film forming process. However, it is easy for Iodine (I) to be desorbed from the first layer and difficult for Iodine (I) to remain in the TiN film, compared to Cl. As a result, the TiN film formed on the wafer 200 can become a high-quality film with low impurity concentration such as Cl or I.

(e) By using a combination of two kinds of the $TiCl_4$ gas and the $TiI_4$ gas as the halogen-based precursors, it is possible to further increase the deposition rate of the TiN film compared to the case of using only the $TiCl_4$ gas.

This is because a Ti—I bond of the $TiI_4$ gas is easily broken compared to a Ti—Cl bond of the $TiCl_4$ gas. That is, the reason is because the $TiI_4$ gas is decomposed easily (a thermal decomposition temperature is lower) and its halogen ligand is separated easily compared to the $TiCl_4$ gas. By using a combination of the $TiCl_4$ gas and the $TiI_4$ gas, from which a halogen ligand is separated easily compared to the $TiCl_4$ gas (in other words, the $TiI_4$ gas has a reactivity (an adsorption property) higher than that of the $TiCl_4$ gas), as the halogen-based precursors, it is possible to promote adsorption of the precursor onto the wafer 200 compared with the case of using only the $TiCl_4$ gas as the halogen-based precursor. This makes it possible to increase the deposition rate of the TiN film.

In the case where the $TiCl_4$ gas is used as the halogen-based precursor, when the $TiCl_4$ gas is supplied to the wafer 200, there may be a case where the $TiCl_4$ gas reacts with the $NH_3$ gas adsorbed on the surface of the wafer 200 or the like to generate a byproduct such as a hydrochloric acid (HCl) gas or the like. This HCl gas may be adsorbed to the TiN layer to take an adsorption site (a reaction site) possessed by the TiN layer during the film formation. As a result, the adsorption of the precursor onto the wafer 200 is hindered, which may cause a reduction in the deposition rate. On the other hand, according to this embodiment in which the $TiI_4$ gas is supplied together with the $TiCl_4$ gas as the halogen-based precursor, it is possible to adsorb the $TiI_4$ gas to the adsorption site before the adsorption site of the TiN layer is taken by the HCl gas. As a result, it is possible to promote the adsorption of the precursor onto the wafer 200 and to increase the deposition rate of the TiN film.

(f) By using a combination of two kinds gases such as the $TiCl_4$ gas and the $TiI_4$ gas as the halogen-based precursors, it is possible to reduce a deposition cost of the TiN film compared to the case of using only the $TiCl_4$ gas. This is because the reactivity of the $TiI_4$ gas is higher than that of the $TiCl_4$ gas as described above, so that the amount of precursor discharged from the interior of the process chamber 201 can be reduced, without being contributed to the formation of the TiN film, by using two kinds of the $TiCl_4$ gas and the $TiI_4$ gas as the halogen-based precursors.

Further, it is easier to reduce the deposition cost of the TiN film than the case of using only the $TiI_4$ gas, by using a combination of two kinds of the $TiCl_4$ gas and the $TiI_4$ gas as the halogen-based precursors. This is because it is possible to further reduce a total gas cost, compared to the case of using only the $TiI_4$ gas, by using a combination of the $TiCl_4$ gas having a low gas cost per one mol and the $TiI_4$ gas having a high gas cost per one mol.

(g) By supplying the $TiCl_4$ gas and the $TiI_4$ gas while overlapping at least portions of their supply periods, it is possible to further shorten a time period required per cycle compared to the case of supplying them without overlapping their supply periods. As a result, it is possible to improve the productivity of the film forming process.

The reason why the $TiCl_4$ gas and the $TiI_4$ gas can be supplied while their supply periods are overlapped that these precursors are both halogen-based precursors and do not react with each other at least under the aforementioned conditions, as described above. By using a combination of the $TiCl_4$ gas and the $TiI_4$ gas which do not react with each other, although the supply periods thereof are overlapped, it is possible to suppress the occurrence of the unintentional vapor phase reaction in the process chamber 201 and to avoid the generation of foreign matter within the process chamber 201. Further, by using a combination of the $TiCl_4$ gas and the $TiI_4$ gas which do not react with each other, although the supply periods thereof are overlapped, it is possible to avoid each gas from being consumed in the gas phase before reaching the wafer 200. As a result, it is possible to control the respective supply amounts of the $TiCl_4$ gas and the $TiI_4$ gas to the wafer 200 with high precision. As described above, by controlling the supply ratio of the $TiCl_4$ gas and the $TiI_4$ gas, it is possible to precisely control the work function and electric resistance of the TiN film.

In addition, the inventors have confirmed that the aforementioned effects may not be achieved in the case of using a combination of the halogen-based titanium precursor such as the $TiCl_4$ gas and an amino-based titanium precursor such as a tetrakis-dimethylaminotitanium $(Ti[N(CH_3)_2]_4)$ gas, i.e., an organic titanium precursor, as the precursors. That is, it has been confirmed that, when the halogen-based titanium precursor and the organic titanium precursor are supplied while their supply periods are overlapped, an unintentional vapor-phase reaction may occur in the process chamber 201 and a large amount of foreign matters may be generated. Further, it has been confirmed that, when the halogen-based titanium precursor and the organic titanium precursor are supplied while their supply periods are overlapped, each gas may be consumed in the gas phase before reaching the wafer 200 and it may be difficult to control the supply amounts of the halogen-based titanium precursor and the organic titanium precursor to the wafer 200 with high precision.

(h) By pre-mixing the $TiCl_4$ gas and the $TiI_4$ gas in the gas supply pipe 232a and in the nozzle 249a and then supplying the same into the process chamber 201, it is possible to control the supply ratio of the TiCl$_4$ gas and the TiI$_4$ gas to the wafer 200 with high precision and to improve the quality of the TiN film.

This is because, by pre-mixing the TiCl$_4$ gas and the TiI$_4$ gas, it is possible to keep a partial pressure ratio between the TiCl$_4$ gas and the TiI$_4$ gas in the process chamber 201 when these gases are supplied to the wafer 200 constant over the entire area within the process chamber 201. That is, it is possible to keep the supply ratio of the TiCl$_4$ gas and the TiI$_4$ gas to the wafer 200 constant over the entire surface of the wafer 200 and across the plurality of wafers 200. As a result, it is possible to improve the uniformity of the work function and electric resistance of the TiN film in a film thickness direction, in the in-plane direction of the wafer 200, and further between the wafers 200. Further, it is also possible to improve the uniformity of the impurity concentration in the TiN film in the film thickness direction, in the in-plane direction of the wafer 200, and further between the wafers 200.

Moreover, the inventors have confirmed that, when the TiCl$_4$ gas and the TiI$_4$ gas are separately supplied into the process chamber 201 and these gases are mixed (post-mixed) in the process chamber 201, the aforementioned effects may not be achieved. This is because, when the TiCl$_4$ gas and the TiI$_4$ gas are separately supplied into the process chamber 201, a predetermined time lag (spreading delay time) may occur when these gases are diffused over the entire area within the process chamber 201 and uniformly mixed. During this time lag, if most of the adsorption sites existing on the surface of the wafer 200 are taken first by one of the TiCl$_4$ gas and the TiI$_4$ gas, it is difficult for the other gas to be adsorbed to the surface of the wafer 200. As a result, the work function and electric resistance of the TiN film, and the impurity concentration in the TiN film may not be uniform in the film thickness direction, in the in-plane direction of the wafer 200, and further between the wafers 200.

The effects mentioned above can be similarly achieved in the case where a halogen-based precursor gas other than the TiCl$_4$ gas is used as the first precursor, or in the case where a halogen-based precursor gas other than the TiI$_4$ gas is used as the second precursor, or in the case where an N-containing gas other than the NH$_3$ gas is used as the reactant.

(4) Exemplary Modifications

The sequence of the film forming process of the present embodiment is not limited to the one illustrated in FIG. 4A but may be modified as in the modifications described below.

(Modification 1)

As in the film forming sequence illustrated below, the TiCl$_4$ gas and the TiBr$_4$ gas may be used as two or more kinds of halogen-based precursors. Even in this case, the TiN film is formed on the wafer 200. The work function of the TiN film tends to be large when only the TiCl$_4$ gas is used as the halogen-based precursor and small when only the TiBr$_4$ gas is used as the halogen-based precursor. Further, similar to the case using Iodine (I), Bromine (Br) also can be desorbed easily from the first layer and difficult to remain in the TiN film, compared to Cl. Thus, even in this modification, the same effects as those of the film forming sequence illustrated in FIG. 4A may be achieved.

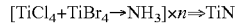

At a step of supplying the TiCl$_4$ gas and the TiBr$_4$ gas to the wafer 200, the supply flow rate of the TiBr$_4$ gas controlled by the MFC 241c may be set to fall within a range of, for example, 100 to 2,000 sccm. Other processing conditions may be similar to the processing conditions of step 1 of the film forming sequence illustrated in FIG. 4A.

Further, as in the film forming sequences illustrated below, a WCl$_6$ gas and a WF$_6$ gas may be used as two or more kinds of halogen-based precursors. In this case, a film containing W and N, i.e., a tungsten nitride film (WN film), is formed on the wafer 200. In the case of using the precursor such as the WCl$_6$ gas or the WF$_6$ gas, a step of supplying a reducing agent such as a B$_2$H$_6$ gas or an SiH$_4$ gas to the wafer 200 may be performed between a step of supplying the WCl$_6$ gas and the WF$_6$ gas to the wafer 200 and a step of supplying the NH$_3$ gas to the wafer 200 in some embodiments. Even in this modification, the same effects as those of the film forming sequence illustrated in FIG. 4A may be achieved.

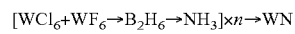

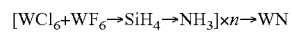

In the step of supplying the WCl$_6$ gas and the WF$_6$ gas to the wafer 200, the internal pressure of the process chamber 201 may be set to fall within a range of, for example, 1 to 5,000 Pa, 10 to 1,000 Pa, or 50 to 500 Pa in some embodiments. The supply flow rate of the WCl$_6$ gas controlled by the MFC 241a and the supply flow rate of the WF$_6$ gas controlled by the MFC 241c may be respectively set to fall within a range of, for example, 1 to 2,000 sccm. The time period, during which a mixture gas of the WCl$_6$ gas and the WF$_6$ gas is supplied to the wafer 200, may be set to fall within a range of, for example, 1 to 120 seconds or 1 to 60 seconds in some embodiments. The temperature of the heater 207 is set such that the temperature of the wafer 200 becomes a temperature which falls within a range of, for example, 150 to 700 degrees C., 180 to 600 degrees C. or 200 to 400 degrees C. in some embodiments. Other processing conditions may be similar to the processing conditions of step 1 of the film forming sequence illustrated in FIG. 4A.

In the step of supplying the reducing agent such as the B$_2$H$_6$ gas or the SiH$_4$ gas to the wafer 200, the supply flow rate of the reducing agent controlled by the MFC 241b may be set to fall within a range of, for example, 1 to 2,000 sccm. Other processing conditions may be similar to the processing conditions of the step of supplying the WCl$_6$ gas and the WF$_6$ gas.

(Modification 2)

Figure 4B:
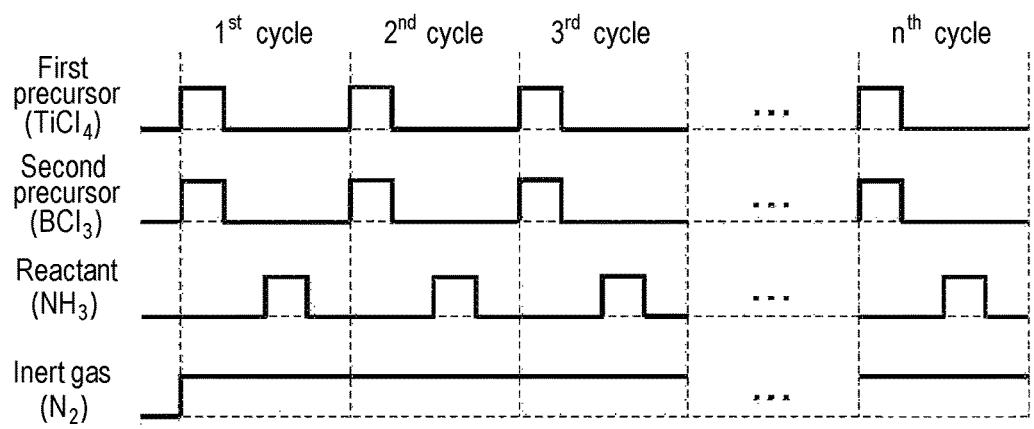
FIG. 4B is a diagram illustrating an exemplary modification of the film forming sequence according to one embodiment of the present disclosure.

Gases whose major elements are different and halogen elements are the same may be used as two or more kinds of halogen-based precursors. For example, as in the film forming sequences illustrated in FIG. 4B and illustrated below, the TiCl$_4$ gas and the BCl$_3$ gas may be used as two or more kinds of halogen elements. In this case, a film containing Ti, B and N, i.e., a titanium boron nitride film (TiBN film), is formed on the wafer 200. Further, as in the film forming sequences illustrated below, the TiCl$_4$ gas and the HfCl$_4$ gas may be used as two or more kinds of halogen elements. In this case, a titanium hafnium nitride film (TiHfN film) containing Ti, Hf and N is formed on the wafer 200. The TiBN film may be referred to as a B-added (doped) TiN film. The TiHfN film may be referred to as an Hf-added (doped) TiN film.

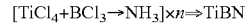

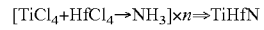

In the step of supplying the TiCl$_4$ gas and the BCl$_3$ gas to the wafer 200, the supply flow rate of the BCl$_3$ gas controlled by the MFC 241c may be set to fall within a range of, for example, 100 to 10,000 sccm. Further, in the step of supplying the TiCl$_4$ gas and the HfCl$_4$ gas to the wafer 200, the supply flow rate of the HfCl$_4$ gas controlled by the MFC 241c may be set to fall within a range of, for example, 100 to 2,000 sccm. Other processing conditions may be similar to the processing conditions of step 1 of the film forming sequence illustrated in FIG. 4A.

The composition of the TiBN film may be arbitrarily adjusted by using a combination of two kinds of the TiCl$_4$ gas and the BCl$_3$ gas as the halogen-based precursors. That is, by appropriately adjusting the supply ratio of the TiCl$_4$ gas and the BCl$_3$ gas to the wafer 200, it is possible to arbitrarily adjust a ratio of Ti and B contained in the TiBN film. Similarly, the composition of the TiHfN film may be arbitrarily adjusted by using a combination of two kinds of the TiCl$_4$ gas and the HfCl$_4$ gas as the halogen-based precursors. That is, by appropriately adjusting the supply ratio of the TiCl$_4$ gas and the HfCl$_4$ gas to the wafer 200, it is possible to arbitrarily adjust the ratio of Ti and Hf contained in the TiHfN film.

In addition, it is possible to precisely control the work function or the like of the film formed on the wafer 200 by using a combination of the TiCl$_4$ gas and the BCl$_3$ gas as the halogen-based precursors. This is because it is possible to control the work function of this film to be increased by adding (doping) B into the TiN film. Therefore, by adjusting the doping amount of B into the TiN film, it is possible to finely adjust the work function of this film to be increased. It is also possible to control the electric resistance of the TiBN film in the same manner.

Similarly, it is possible to precisely control the work function or the like of the film formed on the wafer 200 by using a combination of two types of the TiCl$_4$ gas and the HfCl$_4$ gas as the halogen-based precursors. This is because it is possible to control the work function of this film to be decreased by adding (doping) Hf into the TiN film. Therefore, by adjusting the doping amount of Hf into the TiN film, it is possible to finely adjust the work function of this film to be decreased. It is also possible to control the electric resistance of the TiHfN film by the same method.

Furthermore, when performing the step of supplying the precursor gas to the wafer 200, the metal element or semimetal element (Ti and B, or Ti and Hf) contained in two or more kinds of halogen-based precursors may be alloyed. That is, since alloying may be performed during film formation, it is not necessary to perform heat treatment for diffusing different kinds of metal elements to each other or diffusing the metal elements and semimetal elements to each other after the film forming process. Accordingly, it is possible to simplify the procedure of substrate processing and to reduce the processing cost.

In addition, it is possible to further increase the deposition rate by using a combination of two kinds of the TiCl$_4$ gas and the BCl$_3$ gas as the halogen-based precursors or by using a combination of two kinds of the TiCl$_4$ gas and the HfCl$_4$ gas, compared to the case of using only the TiCl$_4$ gas. This is because, similar to the film forming sequence illustrated in FIG. 4A, the BCl$_3$ gas or the HfCl$_4$ gas can be adsorbed to adsorption sites of the TiBN layer or the TiHfN layer before the adsorption sites are taken by the HCl gas generated during the film forming process. Even in this modification, the adsorption of the precursor onto the wafer 200 can be promoted, increasing the deposition rate.

Further, by supplying the TiCl$_4$ gas and the BCl$_3$ gas while overlapping at least portions of their supply periods or by supplying the TiCl$_4$ gas and the HfCl$_4$ gas while overlapping at least portions of their supply periods, it is possible to shorten the time required per cycle compared with the case of supplying them without overlapping their supply periods. As a result, it is possible to improve the productivity of the film forming process. The reason why the TiCl$_4$ gas and the BCl$_3$ gas or the TiCl$_4$ gas and the HfCl$_4$ gas may be supplied with their supply periods being overlapped may be similar to the reason for the case with the film forming sequence illustrated in FIG. 4A. Even in this modification, since two kinds of halogen-based precursors do not react in the gas phase, it is possible to suppress the generation of foreign matter in the process chamber 201. In addition, it is possible to control the supply amounts of two kinds of halogen-based precursors to the wafer 200 with high precision, and to precisely control the work function, electric resistance or the like of the film formed on the wafer 200.

Further, by pre-mixing the TiCl$_4$ gas and the BCl$_3$ gas or the TiCl$_4$ gas and the HfCl$_4$ gas in the gas supply pipe 232a and in the nozzle 249a, it is possible to control the supply ratio of the TiCl$_4$ gas and the BCl$_3$ gas to the wafer 200 or the supply ratio of the TiCl$_4$ gas and the HfCl$_4$ gas with high precision and to improve the quality of the TiBN film or the TiHfN film. The reason may be similar to the reason for the case with the film forming sequence illustrated FIG. 4A.

(Modification 3)

Figure 4C:
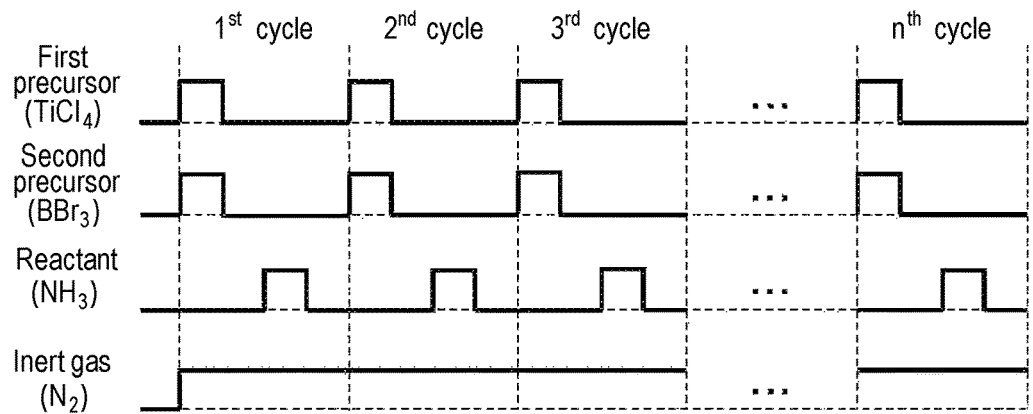
FIG. 4C is a diagram illustrating an exemplary modification of the film forming sequence according to one embodiment of the present disclosure.

Gases whose major elements are different and halogen elements are different may be used as two or more kinds of halogen-based precursors. For example, as in the film forming sequences illustrated in FIG. 4C and illustrated below, the TiCl$_4$ gas and the BBr$_3$ gas may be used as two or more kinds of halogen elements. In this case, a TiBN film is formed on the wafer 200. Further, as in the film forming sequences denoted below, the TiBr$_4$ gas and the HfCl$_4$ gas may be used as two or more kinds of halogen elements. In this case, a TiHfN film is formed on the wafer 200.

According to this modification, the same effects as those of the film forming sequence illustrated in FIG. 4A using two or more kinds of precursor gases having the same major elements and different halogen elements may be achieved. Further, the same effects as those of modification 2 using two or more kinds of precursor gases having different major elements and the same halogen elements may be achieved. In addition, by using gases having different major elements and different halogen elements as two or more kinds of halogen-based precursors, it is possible to precisely control the work function and the electric resistance of the film formed on the wafer 200 in a wide range compared to the case of using gases having the same major elements and different halogen elements or the case of using different major elements and the same halogen elements.

(Modification 4)

The supply ratio of the first precursor and the second precursor may be changed every cycle. That is, at least one of the supply amount of the first precursor and the supply amount of the second precursor may be increased or decreased for each cycle.

Figure 5A:
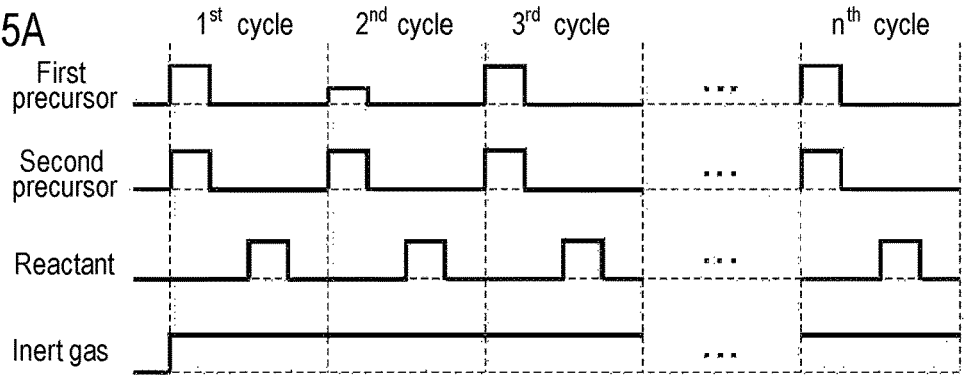
FIG. 5A is a diagram illustrating an exemplary modification of the film forming sequence according to one embodiment of the present disclosure.
Figure 5B:
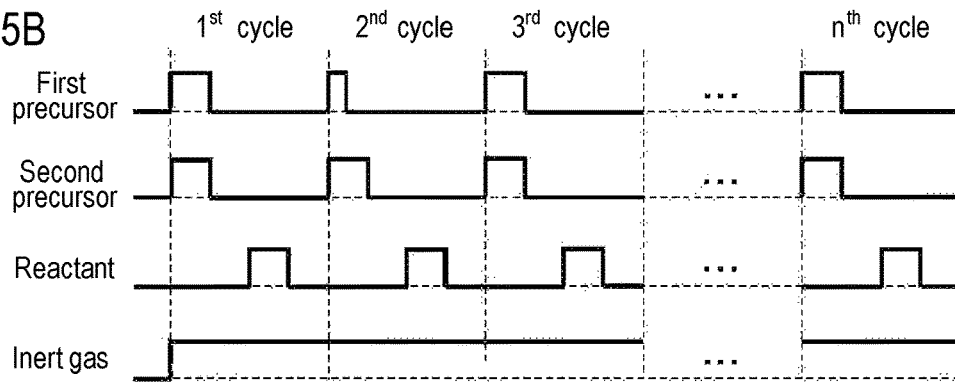
FIG. 5B is a diagram illustrating an exemplary modification of the film forming sequence according to one embodiment of the present disclosure.
Figure 5C:
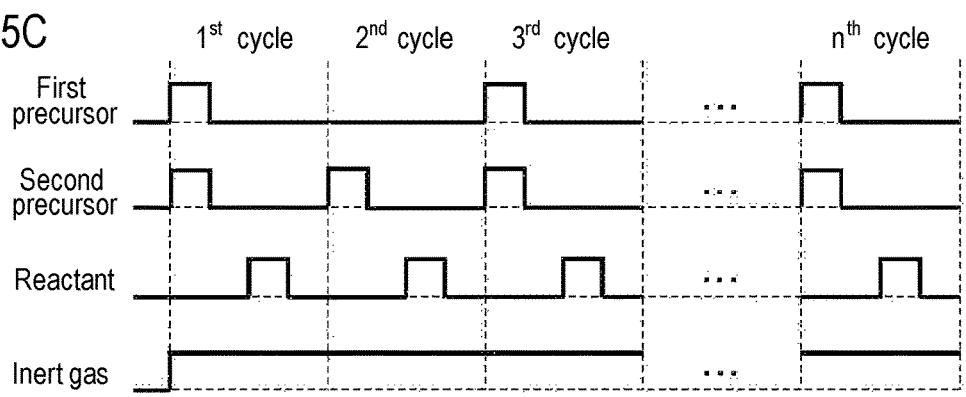
FIG. 5C is a diagram illustrating an exemplary modification of the film forming sequence according to one embodiment of the present disclosure.

For example, at least one of the supply flow rate of the first precursor and the supply flow rate of the second precursor may be changed per cycle (for example, for every subsequent cycle). FIG. 5A illustrates an example in which the supply flow rate of the first precursor is reduced in a specific cycle. Further, for example, at least one of the supply time of the first precursor and the supply time of the second precursor may be changed per cycle (for example, for every subsequent cycle). FIG. 5B illustrates an example in which the supply time of the first precursor is shortened in a specific cycle. Further, for example, at least one of the first precursor and the second precursor may not be supplied in a specific cycle (for example, for every subsequent cycle) (the supply amount is set to zero). FIG. 5C illustrates an example in which the first precursor is not supplied in a specific cycle.

Even in these modifications, the same effects as those of the film forming sequence illustrated in FIG. 4A may be achieved.

Further, according to these modifications, by changing the supply ratio of the first precursor and the second precursor for each cycle, it is possible to finely adjust or change the composition and characteristics of the film formed on the wafer 200 in the film thickness direction. For example, in the case where the $TiCl_4$ gas is used as the first precursor and the $BCl_3$ gas or $HfCl_4$ gas is used as the second precursor to form the TiBN film or the TiHfN film on the wafer 200, the supply ratio of the first precursor to the second precursor (the supply amount of the first precursor/the supply amount of the second precursor) may be set larger at the later stage of the film forming process (the supply amount of the first precursor>the supply amount of the second precursor). In this case, a content ratio of B or Hf, which is likely to be oxidized near a surface of the film formed on the wafer 200 may be decreased and a content ratio of TiN which is difficult to be oxidized, i.e., a content ratio of Ti, may be increased (the surface is rich in Ti). As a result, the film formed on the wafer 200 can become a film having high oxidation resistance on the surface.

According to these modifications, by changing the supply ratio of the first precursor and the second precursor for every subsequent cycle, it is possible to shorten an incubation time of the film forming process and to reduce a cost of the film forming process. For example, in the case where the $TiCl_4$ gas is used as the first precursor and the $TiI_4$ gas is used as the second precursor to form the TiN film on the wafer 200, the supply ratio of the first precursor to the second precursor (the supply amount of the first precursor/the supply amount of the precursor) may be set smaller at the initial stage of the film forming process (the supply amount of the first precursor<the supply amount of the second precursor). In this case, the $TiI_4$ gas, which has higher reactivity than that of the $TiCl_4$ gas, is supplied to the wafer 200 in a large amount in the initial stage of the film forming process. Thus, it is possible to shorten the incubation time of the film forming process. Further, the supply ratio (the supply amount of the first precursor/the supply amount of the second precursor) of the first precursor to the second precursor may be set larger (the supply amount of the first precursor>the supply amount of the second precursor) in a middle stage or a later stage of the film forming process. In this case, it is possible to reduce the use amount of the $TiI_4$ gas which is higher in cost than the $TiCl_4$ gas, and to reduce the cost of the film forming process.

(Modification 5)

The supply timing of at least one of two or more kinds of halogen-based precursors may be changed every cycle (for example, every subsequent cycle). The film forming sequence illustrated in FIG. 5D illustrates an example in which the supply timing of the first precursor is delayed from the supply timing of the second precursor in a specific cycle.

Even in this modification, the same effects as those of the film forming sequence illustrated in FIG. 4A may be achieved. Further, according to this modification, it is possible to suppress adsorption sites of one precursor from being taken by another precursor of two or more kinds of halogen-based precursors in a specific cycle, to intentionally have the adsorption sites of one precursor be taken by another precursor, to finely adjust the composition and characteristics of the film formed on the wafer 200 or to change the same in the film thickness direction.

Figure 5D:
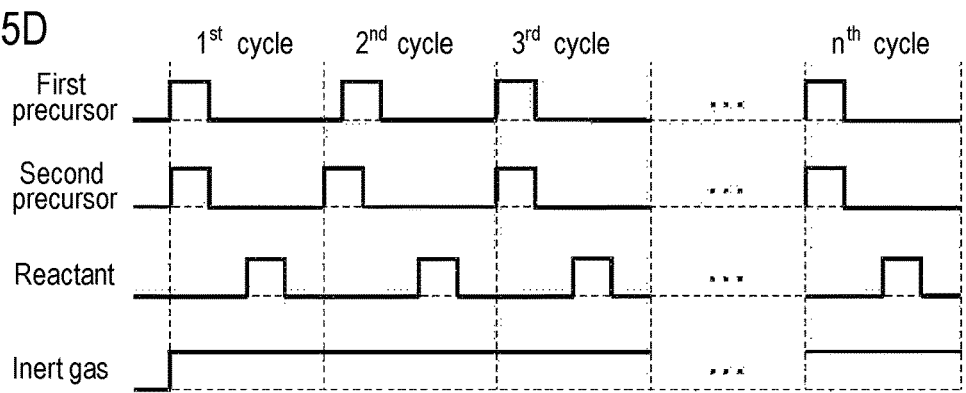
FIG. 5D is a diagram illustrating an exemplary modification of the film forming sequence according to one embodiment of the present disclosure.

For example, in the case where a gas having higher reactivity than that of the second precursor is used as the first precursor, by setting the supply timing of the first precursor in a specific cycle to be delayed from the supply timing of the second precursor as in the film forming sequence illustrated in FIG. 5D, it is possible to promote adsorption of the second precursor gas to the adsorption site in the corresponding cycle. By performing this timing control for every cycle, it is possible to finely adjust the composition and characteristics of the film formed on the wafer 200 or change the same in the film thickness direction.

(Modification 6)

The supply amount of the first precursor and the supply amount of the second precursor may be respectively changed every cycle.

Figure 6A:
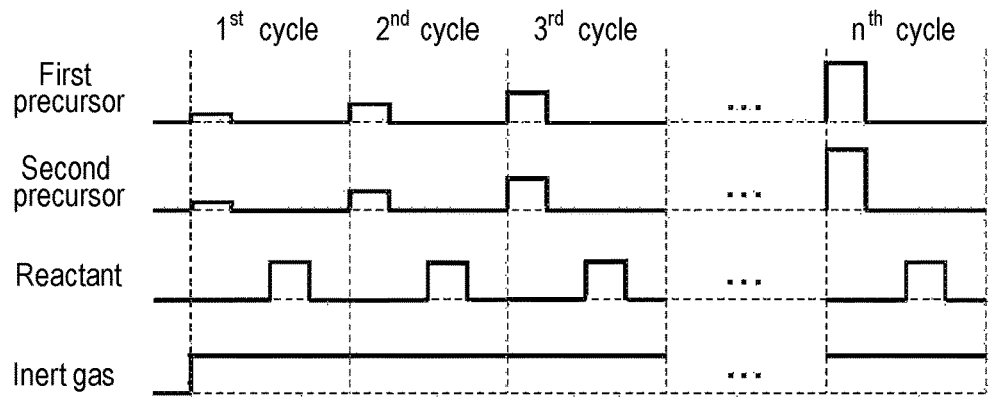
FIG. 6A is a diagram illustrating an exemplary modification of the film forming sequence according to one embodiment of the present disclosure.
Figure 6B:
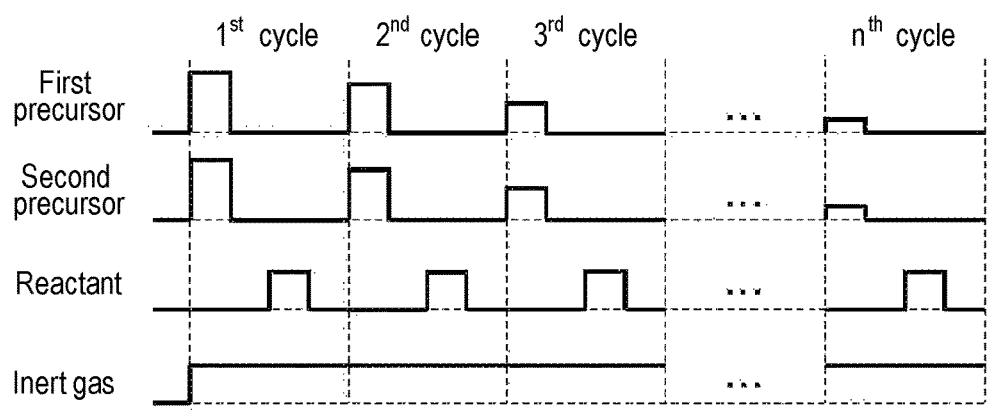
FIG. 6B is a diagram illustrating an exemplary modification of the film forming sequence according to one embodiment of the present disclosure.
Figure 6C:
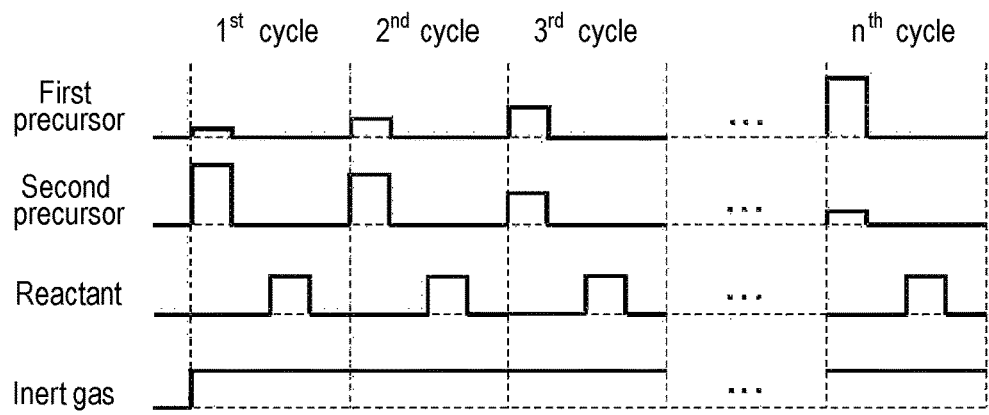
FIG. 6C is a diagram illustrating an exemplary modification of the film forming sequence according to one embodiment of the present disclosure.

For example, as illustrated in FIG. 6A, the supply flow rate of the first precursor and the supply flow rate of the second precursor may be respectively and gradually increased from an initial stage to a later stage of the film forming process. Further, for example, as illustrated in FIG. 6B, the supply flow rate of the first precursor and the supply flow rate of the second precursor may be respectively and gradually reduced from the initial stage to the later stage of the film forming process. In addition, for example, as illustrated in FIG. 6C, the supply flow rate of the first precursor may be gradually increased from the initial stage to the late stage of the film forming process, and the supply flow rate of the second precursor may be gradually reduced from the initial stage to the later stage of the film forming process.

Figure 7A:
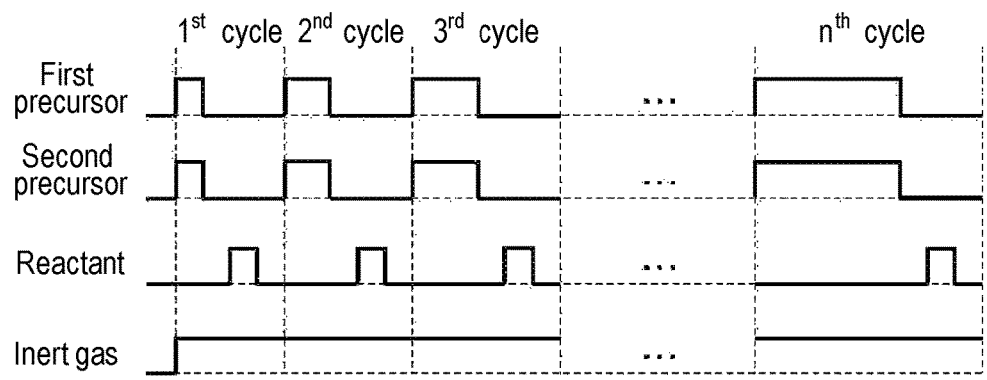
FIG. 7A is a diagram illustrating an exemplary modification of the film forming sequence according to one embodiment of the present disclosure.
Figure 7B:
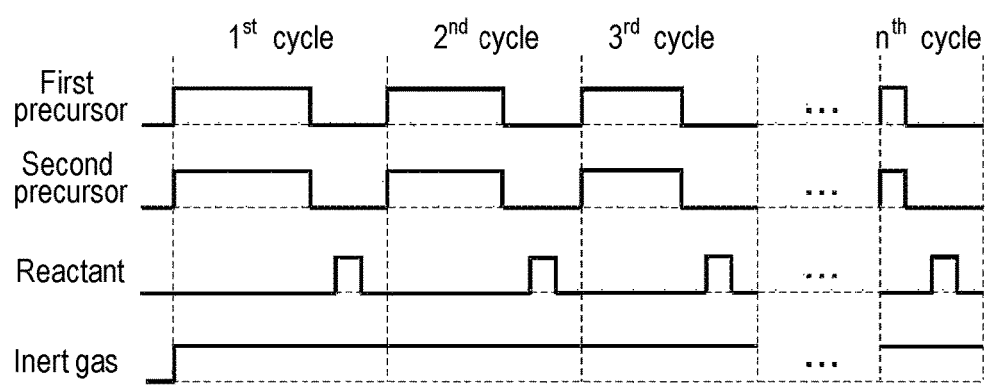
FIG. 7B is a diagram illustrating an exemplary modification of the film forming sequence according to one embodiment of the present disclosure.
Figure 7C:
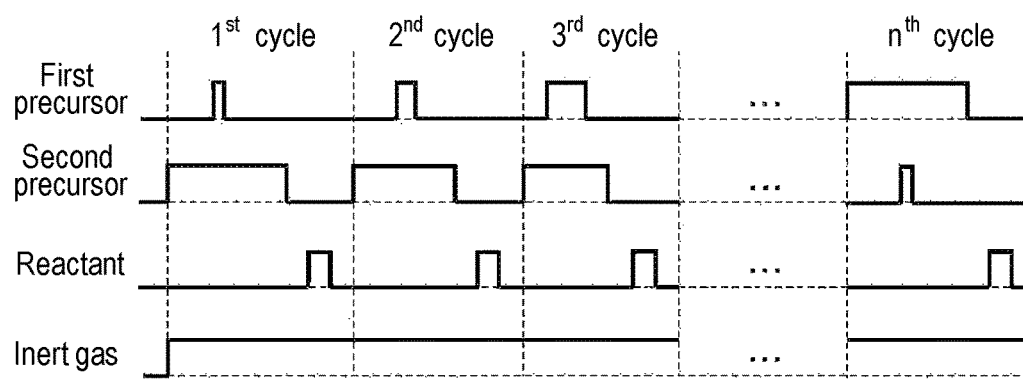
FIG. 7C is a diagram illustrating an exemplary modification of the film forming sequence according to one embodiment of the present disclosure.

Further, for example, as illustrated in FIG. 7A, the supply time of the first precursor and the supply time of the second precursor may be respectively and gradually lengthened from the initial stage to the later stage of the film forming process. Further, for example, as illustrated in FIG. 7B, the supply time of the first precursor and the supply time of the second precursor may be respectively and gradually shortened from the initial stage to the later stage of the film forming process. In addition, for example, as illustrated in FIG. 7C, the supply time of the first precursor may be gradually lengthened from the initial stage to the later stage of the film forming process, and the supply time of the second precursor may be gradually shortened from the initial stage to the later stage of the film forming process.

Even in this modification, the same effects as those of the film forming sequence illustrated in FIG. 4A may be achieved. Further, in the case where a precursor whose deposition rate is gradually decreased from the initial stage to the later stage of the film forming process is selected, the film forming sequence illustrated in FIG. 6A or FIG. 7A is particularly effective in that the decrease in the deposition rate at the later stage of the film forming process can be suppressed. In addition, in the case where a precursor whose deposition rate is insufficient for reasons such as compatibility with the base at the initial stage of the film forming process is selected, the film forming sequence illustrated in FIG. 6B or FIG. 7B is particularly effective in that the insufficiency of the deposition rate at the initial stage of the film forming process can be compensated. Further, the film forming sequence illustrated in FIG. 6C or FIG. 7C is particularly effective in that the composition and quality of the film formed on the wafer 200 can be continuously changed in the film thickness direction.

(Modification 7)

The supply timing of the first precursor and the supply timing of the second precursor may be different within a cycle. For example, the supply start timing of the first precursor and the supply start timing of the second precursor may be different within a cycle. Further, for example, the supply stop timing of the first precursor and the supply stop timing of the second precursor may be different within a cycle. Then, the supply time of the first precursor and the supply time of the second precursor may be different within a cycle.

Figure 8A:
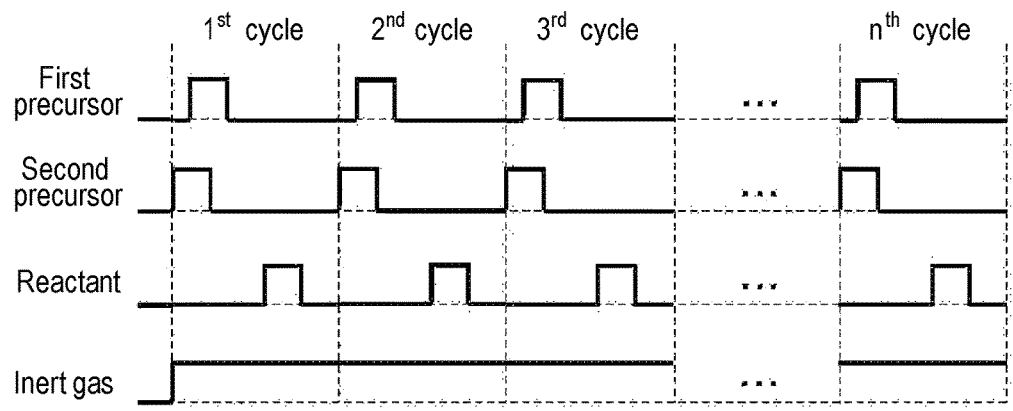
FIG. 8A is a diagram illustrating an exemplary modification of the film forming sequence according to one embodiment of the present disclosure.
Figure 8B:
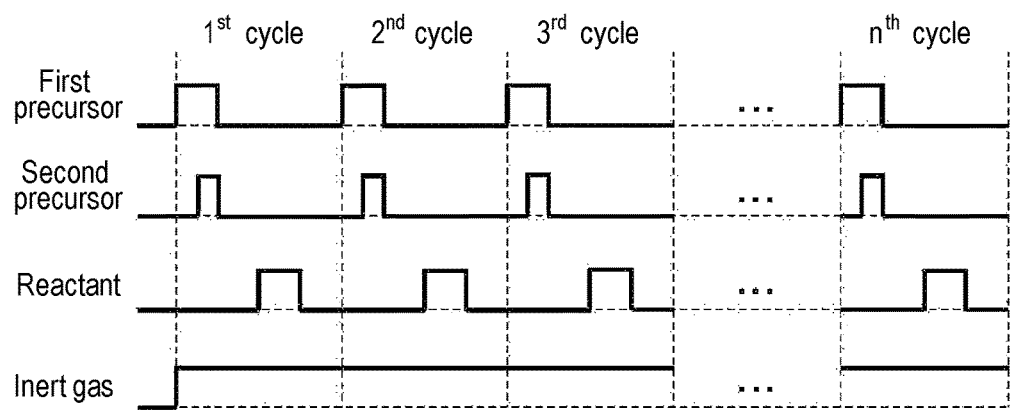
FIG. 8B is a diagram illustrating an exemplary modification of the film forming sequence according to one embodiment of the present disclosure.
Figure 8C:
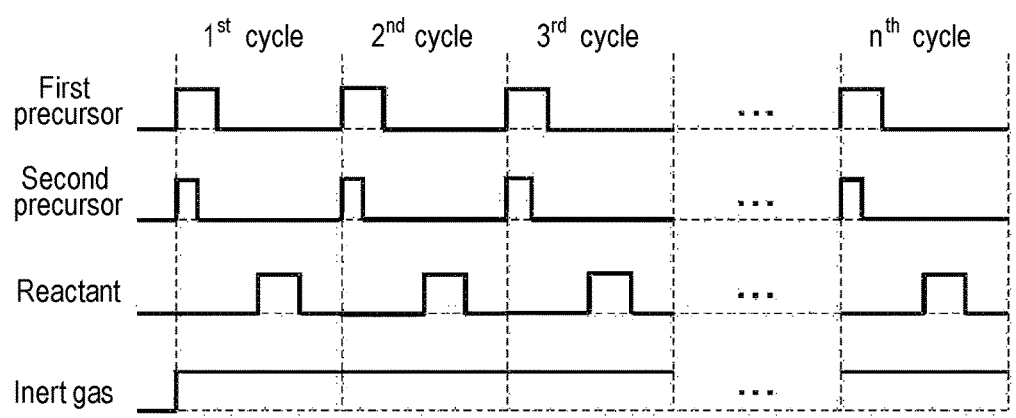
FIG. 8C is a diagram illustrating an exemplary modification of the film forming sequence according to one embodiment of the present disclosure.

FIG. 8A illustrates an example in which the supply timing of the first precursor is delayed from the supply timing of the second precursor while the supply time of the first precursor and the supply time of the second precursor are the same within each cycle. FIG. 8B illustrates an example in which the supply time of the second precursor is set shorter than the supply time of the first precursor by setting the supply start timing of the second precursor to be delayed from the supply start timing of the first precursor within each cycle and by setting the supply stop of the first precursor and the supply stop of the second precursor at the same timing. FIG. 8C illustrates an example in which the supply time of the second precursor is set shorter than the supply time of the first precursor by setting the supply stop timing of the second precursor earlier than the supply stop timing of the first precursor while setting the supply start of the first precursor and the supply start of the second precursor at the same timing within each cycle.

Even in this modification, the same effects as those of the film forming sequence illustrated in FIG. 4A may be achieved.

Further, according to this modification, it is possible to prevent adsorption sites of one precursor from being taken by another precursor, promoting adsorption of the one precursor onto the wafer 200.

For example, in the case where a gas having lower reactivity than that of the first precursor is used as the second precursor, by setting the supply timing of the first precursor to be delayed from the supply timing of the second precursor as in the film forming sequence illustrated in FIG. 8A, it is possible to sufficiently secure adsorption sites of the second precursor in each cycle and to promote adsorption of the second precursor onto the wafer 200. Further, in this case, the supply timing of the second precursor may be delayed from the supply timing of the first precursor. By doing so, it is possible to appropriately suppress the adsorption of the second precursor onto the wafer 200 and to control the component of the first precursor contained in the film formed on the wafer 200 so as to be rich. The same effects may also be achieved by setting the supply time of the second precursor shorter than the supply time of the first precursor.

Further, for example, in the case where a gas having higher reactivity than that of the first precursor is used as the second precursor, by setting the supply start timing of the second precursor to be delayed from the supply start timing of the first precursor as in the film forming sequence illustrated in FIG. 8B, or by setting the supply time of the second precursor shorter than the supply time of the first precursor as in the film forming sequence illustrated in FIG. 8B or 8C, it is possible to sufficiently secure the adsorption site of the first precursor in each cycle and to promote the adsorption of the first precursor onto the wafer 200. In this case, the supply timing of the first precursor may also be delayed from the supply timing of the second precursor. By doing so, it is possible to appropriately suppress the adsorption of the first precursor onto the wafer 200 and to control the component of the second precursor contained in the film formed on the wafer 200 so as to be rich. The same effects may also be achieved by setting the supply time of the first precursor shorter than the supply time of the second precursor.

Thus, it is possible to finely adjust the composition and characteristics, for example, the work function and electric resistance, of the film formed on the wafer 200.

In addition, according to this modification, it can be controlled such that the composition of a surface of a layer to be modified by the reactant (a modification target layer) becomes an optimum composition. For example, in the film forming sequence illustrated in FIG. 8A or FIG. 8C, since formation of the modification target layer is terminated by the supply of the first precursor, the composition of the surface of this layer may be controlled to be suitable for modification process (a state in which the major element contained in the first precursor is rich).

(Modification 8)

At least one of the supply flow rate of the first precursor and the supply flow rate of the second precursor may be changed within a cycle.

Figure 9A:
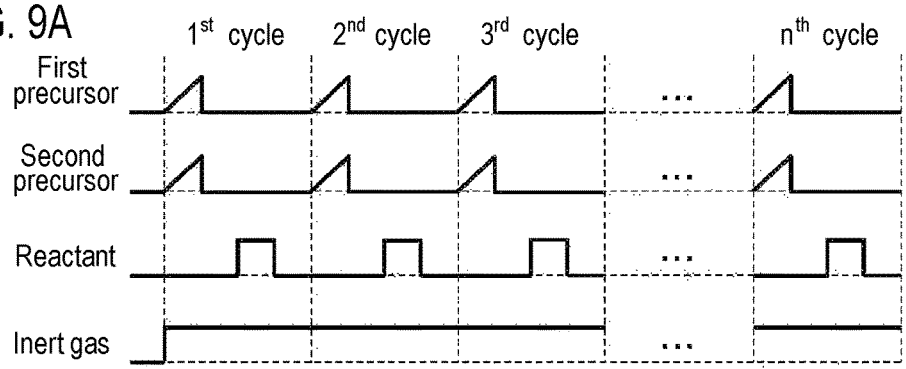
FIG. 9A is a diagram illustrating an exemplary modification of the film forming sequence according to one embodiment of the present disclosure.
Figure 9B:
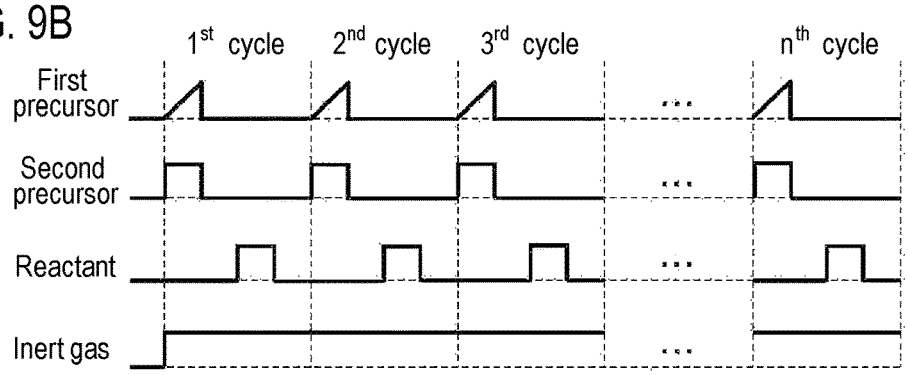
FIG. 9B is a diagram illustrating an exemplary modification of the film forming sequence according to one embodiment of the present disclosure.

For example, at least one of the supply flow rate of the first precursor and the supply flow rate of the second precursor may be gradually increased within a cycle. FIG. 9A illustrates an example in which the supply flow rate of the first precursor and the supply flow rate of the second precursor are respectively and gradually increased within a cycle. According to the film forming sequence illustrated in FIG. 9A, it is possible to moderate the formation of the byproduct by the reaction of the first precursor and the second precursor supplied into the process chamber 201 at step 1 and the reactant adsorbed in the process chamber 201 at the start timing of step 1. As a result, it is possible to improve the quality of the film formed on the wafer 200. Further, in the case where the first precursor intensively generates the byproduct by the reaction with the reactant compared to the second precursor, as in the film forming sequence illustrated in FIG. 9B, only the supply flow rate of the first precursor may be gradually increased within a cycle.

Figure 9C:
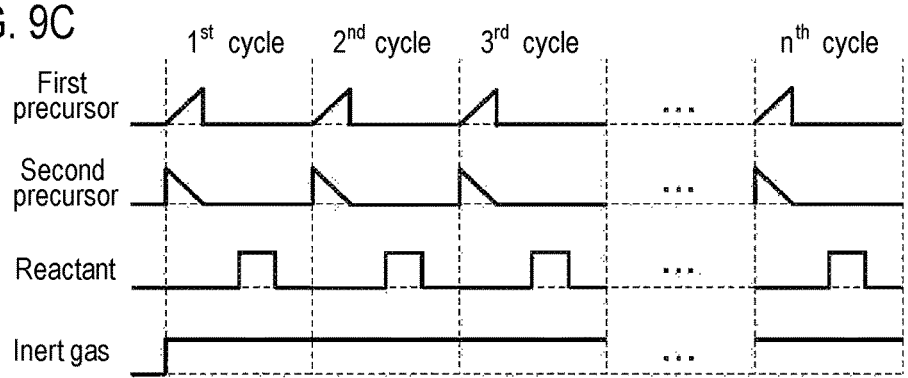
FIG. 9C is a diagram illustrating an exemplary modification of the film forming sequence according to one embodiment of the present disclosure.

In addition, for example, at least one of the supply flow rate of the first precursor and the supply flow rate of the second precursor may be gradually increased within a cycle and the other may be gradually decreased within the cycle. FIG. 9C illustrates an example in which the supply flow rate of the first precursor is gradually increased within a cycle and the supply flow rate of the second precursor is gradually decreased within the cycle. The film forming sequence illustrated in FIG. 9C is particularly effective when there is a large difference in reactivity and diffusion rate between the first precursor and the second precursor. For example, in the case where a gas having lower reactivity than that of the first precursor is used as the second precursor, by controlling the supply flow rate of each precursor as in the film forming sequence illustrated in FIG. 9C, it is possible to sufficiently secure the adsorption site of the second precursor at the initial stage of each cycle and to promote the adsorption of the second precursor onto the wafer 200. In the case where a gas having a diffusion rate lower than that of the first precursor is used as the second precursor, by controlling the supply flow rate of the precursor as in the film forming sequence illustrated in FIG. 9C, although the first precursor and the second precursor are separately supplied into the process chamber 201 so as to be post-mixed, it is possible to sufficiently secure the adsorption site of the second precursor at the initial stage of each cycle and to promote the adsorption of the second precursor onto the wafer 200.

Figure 9D:
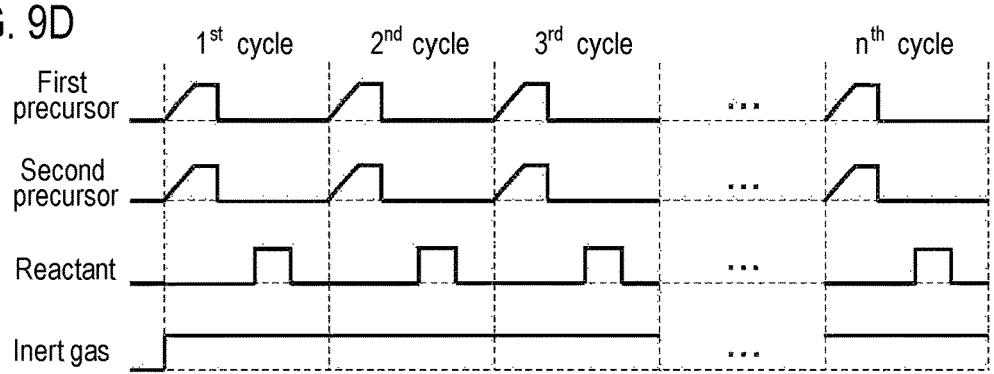
FIG. 9D is a diagram illustrating an exemplary modification of the film forming sequence according to one embodiment of the present disclosure.

Further, for example, in the case where the supply flow rate of the precursor is gradually increased, when the supply flow rate of the precursor reaches a predetermined flow rate, the state may be maintained for a predetermined period of time. FIG. 9D illustrates an example in which the supply flow rate of each of the first precursor and the second precursor is gradually increased within a cycle and, when the supply flow rate reaches a predetermined flow rate, the state is maintained for a predetermined period of time. The film forming sequence illustrated in FIG. 9D is particularly effective when the volume of the process chamber 201 is large as in the case with the vertical type processing furnace. If the internal volume of the process chamber 201 is large, the same effects as those of the film forming sequence illustrated in FIG. 9A may be achieved by controlling the supply flow rate of the precursor as in the film forming sequence illustrated in FIG. 9D. In addition, it is possible to distribute the precursor to the corners of the process chamber 201, and to improve the film thickness uniformity or the like of the film formed on the wafer 200 on the wafer surface or between the wafers.

(Modification 9)

One of the first precursor, the second precursor and the reactant may be intermittently supplied, and others may be continuously supplied.

Figure 10A:
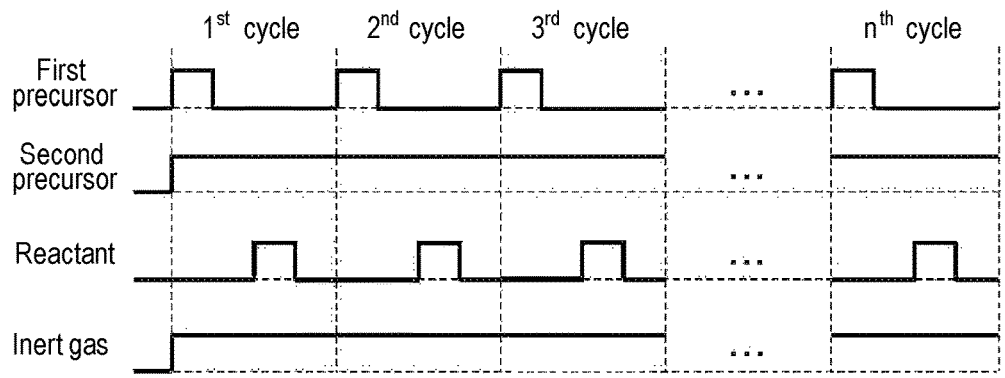
FIG. 10A is a diagram illustrating an exemplary modification of the film forming sequence according to one embodiment of the present disclosure.

FIG. 10A illustrates an example in which the first precursor and the reactant are respectively and intermittently supplied and the second precursor is continuously supplied. According to the film forming sequence illustrated in FIG. 10A, it is possible to prevent the adsorption sites from being taken by the byproduct generated by the reaction between the first precursor and the reactant. For example, in the case where the $TiCl_4$ gas is used as the first precursor, the $BCl_3$ gas is used as the second precursor and the $NH_3$ gas is used as the reactant, by controlling the supply of each gas as in the film forming sequence illustrated in FIG. 10A, it is possible to adsorb the $BCl_3$ gas to adsorption sites of TiBN layer before the adsorption sites are taken by the HCl gas generated during the film forming process. As a result, it is possible to improve the deposition rate of the TiBN film. Furthermore, according to the film forming sequence illustrated in FIG. 10A, since a step of simultaneously supplying the second precursor and the reactant is performed every cycle, it is possible to appropriately promote the gas phase reaction and to improve the deposition rate.

Figure 10B:
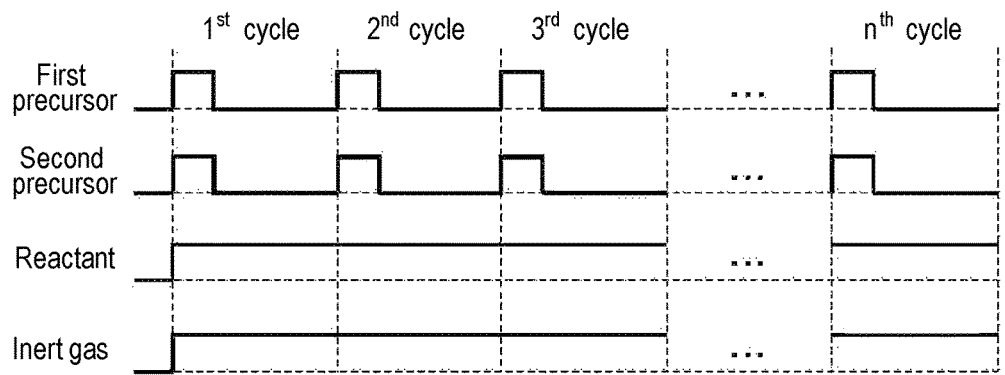
FIG. 10B is a diagram illustrating an exemplary modification of the film forming sequence according to one embodiment of the present disclosure.

In addition, FIG. 10B illustrates an example in which the first precursor and the second precursor are intermittently supplied and the reactant is continuously supplied. According to the film forming sequence illustrated in FIG. 10B, since a step of simultaneously supplying two types of precursors and the reactant is performed every cycle, it is possible to appropriately promote the gas phase reaction and to improve the deposition rate.

(Modification 10)

Figure 11:
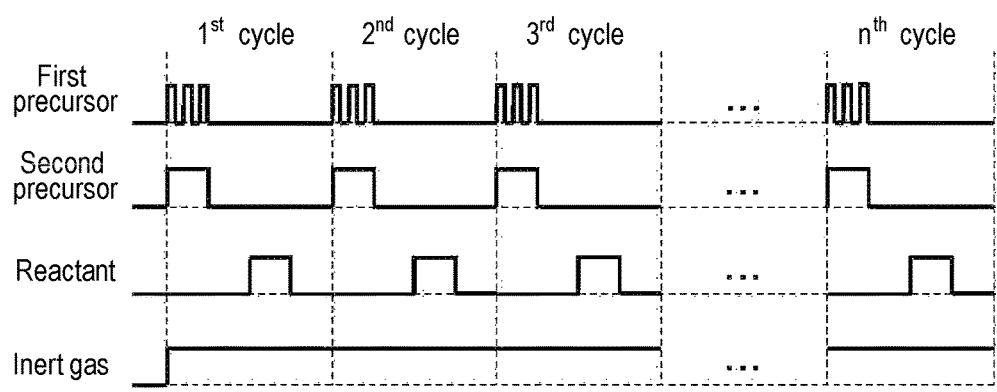
FIG. 11 is a diagram illustrating an exemplary modification of the film forming sequence according to one embodiment of the present disclosure.

During the supply period of one of the first precursor and the second precursor, the other precursors may be intermittently supplied. FIG. 11 illustrates an example in which the second precursor and the reactant are respectively and intermittently supplied and the first precursor is intermittently supplied during the supply period of the second precursor. According to this modification, it is possible to moderate the generation of the byproduct by the reaction of the first precursor supplied into the process chamber 201 at step 1 and the reactant adsorbed in the process chamber 201 at the start timing of step 1. As a result, it is possible to improve the quality of the film formed on the wafer 200.

(Modification 11)

Figure 12A:
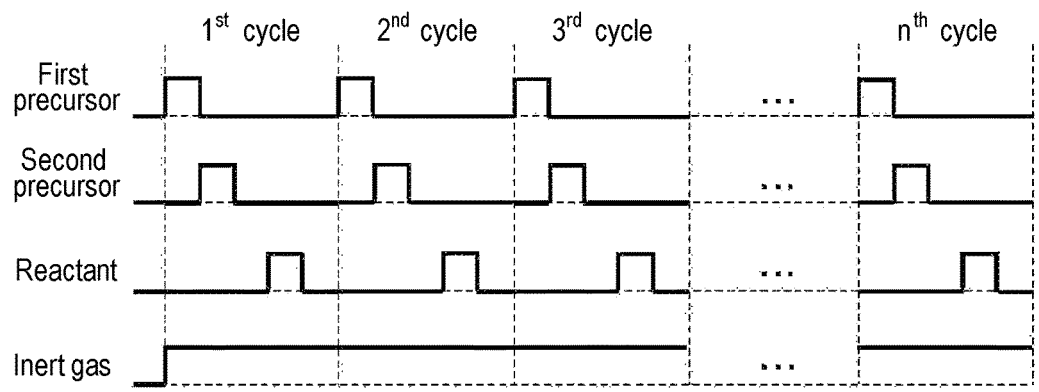
FIG. 12A is a diagram illustrating an exemplary modification of the film forming sequence according to one embodiment of the present disclosure.
Figure 12B:
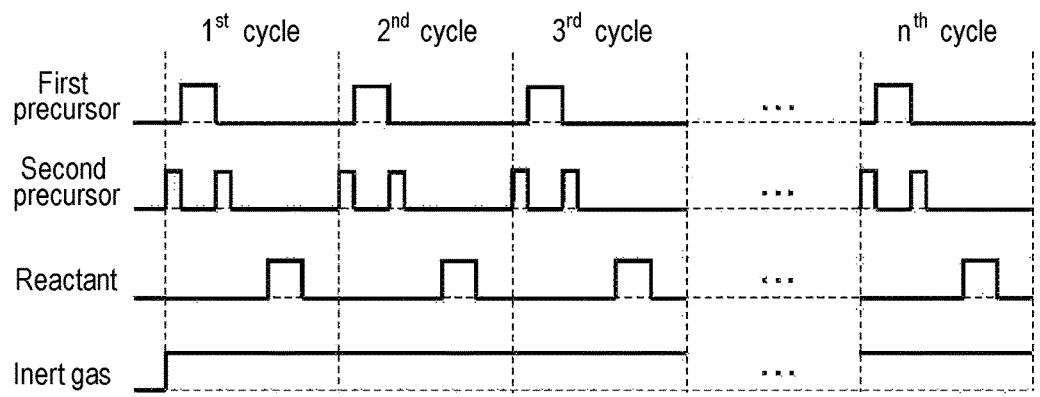
FIG. 12B is a diagram illustrating an exemplary modification of the film forming sequence according to one embodiment of the present disclosure.

The first precursor and the second precursor may be respectively supplied without their supply periods being overlapped. For example, as illustrated in FIG. 12A, the supply of the second precursor may be performed after the supply of the first precursor is completed. Even in this case, the same effects as those of the film forming sequence illustrated in FIG. 8B may be achieved. Furthermore, for example, as illustrated in FIG. 12B, the supply of the second precursor may be performed before the supply start and after the supply completion of the first precursor respectively. Even in this case, the same effects as those of the film forming sequence illustrated in FIG. 8A may be achieved. Further, according to the film forming sequence of FIG. 12B, since the supply of the second precursor is performed twice per cycle, it becomes easy to finely adjust an adsorption amount of the second precursor onto the wafer 200.

<Other Embodiments>

While one embodiment of the present disclosure has been specifically described above, the present disclosure is not limited to the aforementioned embodiment but may be differently modified without departing from the spirit of the present disclosure.

For example, in the aforementioned embodiment, there has been described an example in which a reactant is supplied after supplying two kinds of halogen-based precursors. However, the present disclosure is not limited to the aforementioned embodiment and the order of supplying the precursors and the reactant may be reversed. That is, the precursors may be supplied after supplying the reactant. By changing the supply order, it is possible to change the quality and the composition ratio of a film to be formed.

Further, for example, in the aforementioned embodiment, there has been described a case where a film forming process is performed using two kinds of halogen-based precursors and a reactant. However, the present disclosure is not limited to the aforementioned embodiment and the film forming process may be performed using three or more kinds of halogen-based precursors and a reactant. That is, three or more kinds of halogen-based precursors may be supplied with at least portions of their supply periods being overlapped. In addition, at least two or more kinds of halogen-based precursors, among three or more kinds of halogen-based precursors, may be supplied with at least portions of their supply periods being overlapped.

Further, for example, in the aforementioned embodiment, there has been described a case where the precursor and the reactant are supplied to the wafer 200 by thermal activation (thermal excitation) in a non-plasma atmosphere. However, the present disclosure is not limited to the aforementioned embodiment and at least one of the precursor and the reactant may be activated by plasma (plasma-excited) and supplied. For example, in the case where the precursor is activated by plasma and supplied, it is possible to promote the adsorption of the precursor onto the wafer 200 or reduce the impurity concentration in the film formed on the wafer 200. Further, for example, in the case where the reactant is activated by plasma and supplied, it is possible to promote the modification of the film formed on the wafer 200 or reduce the impurity concentration in the film formed on the wafer 200.

In addition, for example, in the aforementioned embodiment, there has been described a case where a metal nitride film is formed on the wafer 200. However, the present disclosure may also be applied to a case where a nitride film containing a semimetal element such as Si, Ge, B, Sb, Te or the like, i.e., a semimetal nitride film, is formed on the wafer 200. Further, the present disclosure may be applied to a case where a nitride film containing a metal element and a semimetal element is formed on a wafer 200. For example, the present disclosure may be applied to a case where a silicon nitride film (SiN film), a boron nitride film (BN film), a silicon boron itride film (SiBN film) or the like is formed on the wafer 200 or a case where a titanium silicon nitride film (TiSiN film), a hafnium silicon nitride film (HfSiN film), a zirconium silicon nitride film (ZrSiN film) or the like is formed on the wafer 200.

For example, an SiN film, a BN film, an SiBN film, a TiSiN film, an HfSiN film or the like may be formed on the wafer 200 by the film forming sequences denoted below.

[SiCl$_4$+SiI$_4$→NH$_3$]×$n$⇒SiN

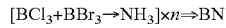
[BCl$_3$+BBr$_3$→NH$_3$]×$n$⇒BN

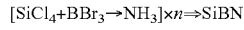
[SiCl$_4$+BBr$_3$→NH$_3$]×$n$⇒SiBN

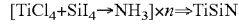
[TiCl$_4$+SiI$_4$→NH$_3$]×$n$⇒TiSiN

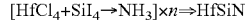
[HfCl$_4$+SiI$_4$→NH$_3$]×$n$⇒HfSiN

The processing procedures and processing conditions of the film forming process at this time may be similar to the processing procedures and processing conditions of the embodiment or the modifications described above. Even in these cases, the same effects as those of the embodiment or the modifications described above may be achieved. That is, the present invention may be applied to a case where a nitride film containing at least one of a metal element and a semimetal element is formed.

Further, for example, in the aforementioned embodiment, there has been described a case where a metal nitride film or the like is formed on the wafer 200 using a nitriding agent such as an NH$_3$ gas used as the reactant. However, the present disclosure may also be applied a case where a metal oxide film, a metal oxynitride film or the like is formed on the wafer 200 using an oxidizing agent such as an oxygen (O$_2$) gas as the reactant. Even in these cases, the same effects as those of the aforementioned embodiment may be achieved for at least the composition ratio control.

For example, a titanium oxide film (TiO film), a titanium hafnium oxide film (TiHfO film), a hafnium silicon oxide film (HfSiO film), a titanium oxynitride film (TiON film), a titanium hafnium oxynitride film (TiHfON film), a hafnium silicon oxynitride film (HfSiON film) or the like may be formed on the wafer 200 by the film forming sequences denoted below.

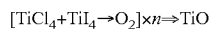
[TiCl$_4$+TiI$_4$→O$_2$]×$n$⇒TiO

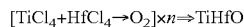
[TiCl$_4$+HfCl$_4$→O$_2$]×$n$⇒TiHfO

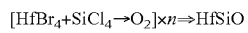
[HfBr$_4$+SiCl$_4$→O$_2$]×$n$⇒HfSiO

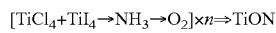
[TiCl$_4$+TiI$_4$→NH$_3$→O$_2$]×$n$⇒TiON

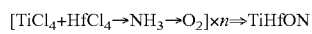
[TiCl$_4$+HfCl$_4$→NH$_3$→O$_2$]×$n$⇒TiHfON

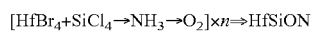
[HfBr$_4$+SiCl$_4$→NH$_3$→O$_2$]×$n$⇒HfSiON

Recipes (programs describing processing procedures, processing conditions and the like) used in substrate processing may be prepared individually according to the processing contents (the kind, composition ratio, quality, film thickness, processing procedure and processing condition of the film as formed) and may be stored in the memory device 121c via a telecommunication line or the external memory device 123 in some embodiments. When the substrate processing is started, the CPU 121a may properly select an appropriate recipe from the recipes stored in the memory device 121c according to the processing contents in some embodiments. Thus, it is possible for a single substrate processing apparatus to form films of different kinds, composition ratios, qualities and thicknesses with enhanced reproducibility. In addition, it is possible to reduce an operator's burden (an input burden when the operator inputs processing procedures, processing conditions and the like) and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may be applied to, e.g., a case where films are formed using a single-wafer-type substrate processing apparatus capable of processing a single substrate or several substrates at a time. In addition, in the aforementioned embodiment, there has been described an example in which films are formed using a substrate processing apparatus including a hot-wall-type processing furnace. The present disclosure is not limited to the aforementioned embodiment but may also be applied to a case where films are formed using a substrate processing apparatus including a cold-wall-type processing furnace. Even in these cases, processing procedures and processing conditions may be similar to, for example, the processing procedures and the processing conditions of the aforementioned embodiment.

Figure 13:
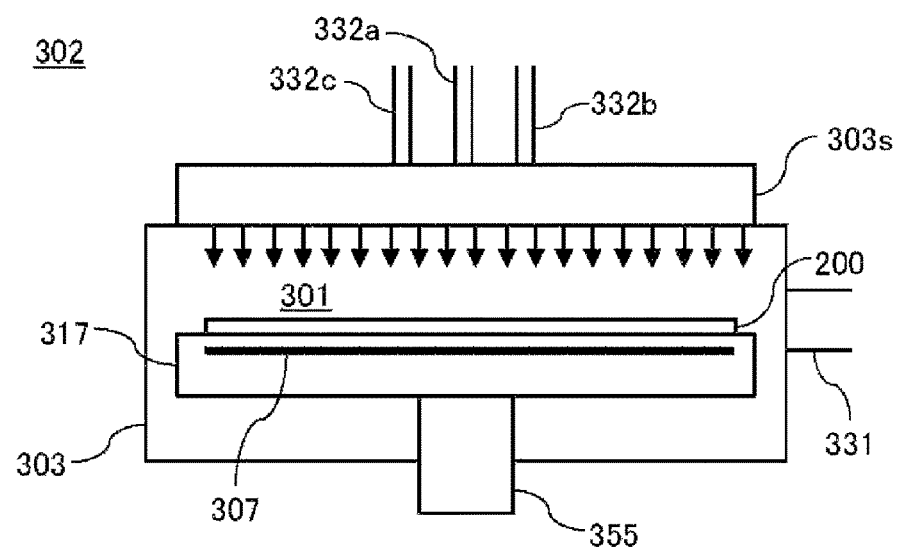
FIG. 13 is a schematic configuration diagram of a processing furnace of a substrate processing apparatus used in another embodiment of the present disclosure, in which the portion of the processing furnace is shown in a vertical cross sectional view.

The present disclosure may also be applied to, e.g., a case where a film is formed using a substrate processing apparatus including a processing furnace 302 illustrated in FIG. 13. The processing furnace 302 includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. Gas supply ports 332a to 332c are connected to inlets (a gas introduction port) of the shower head 303s. A supply system similar to the precursor supply system of the aforementioned embodiment is connected to the gas supply ports 332a and 332c. The gas supplied from the precursor supply system is pre-mixed in the shower head 303s and then supplied into the processing chamber 301. A supply system similar to the reactant supply system of the aforementioned embodiment is connected to the gas supply port 332b. A gas distribution plate configured to supply a gas into the process chamber 301 in a shower-like manner is installed in outlets (gas discharge holes) of the shower head 303s. The shower head 303s is installed in such a position as to face the surfaces of the wafers 200 carried into the process chamber 301. An exhaust port 331 configured to evacuate the interior of the process chamber 301 is installed in the process vessel 303. An exhaust system similar to the exhaust system of the aforementioned embodiment is connected to the exhaust port 331.

Figure 14:
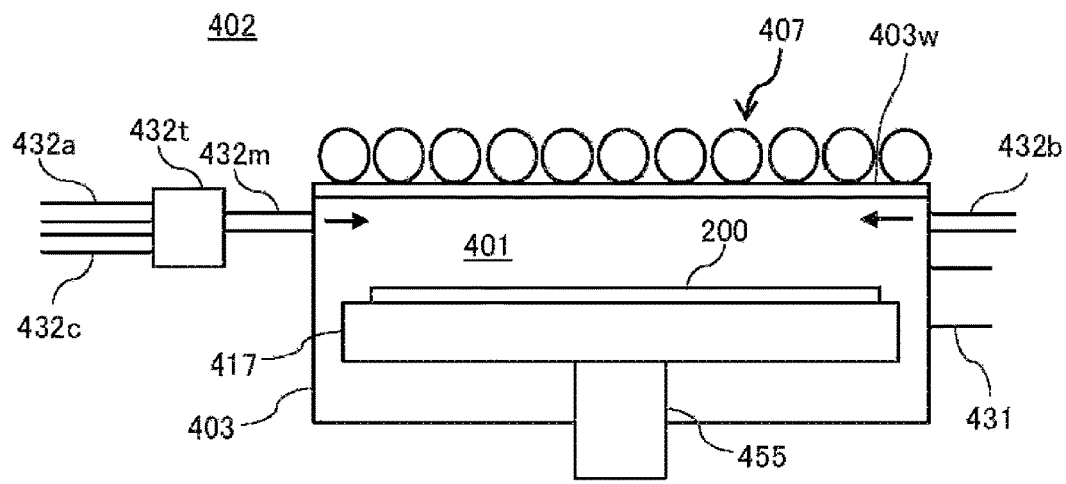
FIG. 14 is a schematic configuration diagram of a processing furnace of a substrate processing apparatus used in another embodiment of the present disclosure, in which the portion of the processing furnace is shown in a vertical cross sectional view.

In addition, the present disclosure may also be applied to, e.g., a case where a film is formed using a substrate processing apparatus including a processing furnace 402 illustrated in FIG. 14. The processing furnace 402 includes a process vessel 403 which defines a process chamber 401, a support table 417 configured to horizontally support one or more wafers 200, a rotary shaft 455 configured to support the support table 417 from below, a lamp heater 407 configured to apply irradiation light toward the wafers 200 disposed in the process vessel 403, and a quartz window 403w which transmits the light irradiated from the lamp heater 407. Gas supply ports 432a and 432c are connected to the process vessel 403 via a gas supply port 432m and a gas mixing chamber 432t. A supply system similar to the precursor supply system of the aforementioned embodiment is connected to the gas supply ports 432a and 422c. The gas supplied from the precursor supply system is pre-mixed in the gas mixing chamber 432t and in the gas supply port 432m, and then supplied into the process chamber 401. In addition, a gas supply port 432b is connected to the process vessel 403. A supply system similar to the reactant supply system of the aforementioned embodiment are connected to the gas supply port 432b. The gas supply ports 432m and 432b are respectively installed at lateral sides of end portions of the wafers 200 carried into the process chamber 401, namely in such positions as not to face the surfaces of the wafers 200 carried into the process chamber 401. An exhaust port 431 configured to evacuate the interior of the process chamber 401 is installed in the process vessel 403. An exhaust system similar to the exhaust system of the aforementioned embodiment is connected to the exhaust port 431.

In the case of using these substrate processing apparatuses, a film forming process may be performed by the processing procedures and processing conditions similar to those of the embodiment and modifications described above. Effects similar to those of the embodiment and modifications described above may be achieved. Further, the gas mixing chamber 432t illustrated in FIG. 14 may be installed in the substrate processing apparatus illustrated in FIG. 1. That is, two kinds of precursors supplied from the gas supply pipes 232a and 232c may be pre-mixed in the gas mixing chamber 432t and then supplied into the processing chamber 201 via the nozzle 232a.

The embodiment and modifications described above may be appropriately combined with one another. In addition, the processing procedures and processing conditions used at this time may be similar to, for example, the processing procedures and processing conditions of the aforementioned embodiment.

According to the present disclosure in some embodiments, it is possible to improve a quality of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a film on a substrate by performing a cycle a predetermined number of times, the cycle including:
        supplying a first halogen-based precursor to the substrate in a non-plasma atmosphere;
        supplying a second halogen-based precursor to the substrate in the non-plasma atmosphere, wherein the first halogen-based precursor and second halogen-based precursor have same major elements and different halogen elements; and
        supplying a reactant to the substrate in the non-plasma atmosphere, wherein the reactant has a chemical structure different from chemical structures of the first halogen-based precursor and the second halogen-based precursor.

2. The method of claim 1, wherein a supply ratio of the first halogen-based precursor and the second halogen-based precursor is changed per the cycle,
    wherein the second halogen-based precursor is different in type from the first halogen-based precursor.

3. The method of claim 2, wherein at least one of a supply amount of the first halogen-based precursor and a supply amount of the second halogen-based precursor is changed per cycle.

4. The method of claim 3, wherein at least one of a supply flow rate of the first halogen-based precursor and a supply flow rate of the second halogen-based precursor is changed per cycle.

5. The method of claim 3, wherein at least one of a supply time of the first halogen-based precursor and a supply time of the second halogen-based precursor is changed per cycle.

6. The method of claim 1, wherein a supply timing of the first halogen-based precursor and a supply timing of the second halogen-based precursor are different within the cycle,
    wherein the second halogen-based precursor is different from the first halogen-based precursor.

7. The method of claim 1, wherein a supply start timing of the supplying of the first halogen-based precursor and a supply start timing of the second halogen-based precursor are different within the cycle.

8. The method of claim 1, wherein a supply stop timing of the supplying of the first halogen-based precursor and a supply stop timing of the supplying of the second halogen-based precursor are different within the cycle.

9. The method of claim 1, wherein a supply time of the first halogen-based precursor and a supply time of the second halogen-based precursor are different within the cycle.

10. The method of claim 1, wherein at least one of a supply flow rate of the first halogen-based precursor and a supply flow rate of the second halogen-based precursor is changed within the cycle,
    wherein the second halogen-based precursor is different from the first halogen-based precursor.

11. The method of claim 10, wherein at least one of the supply flow rate of the first halogen-based precursor and the supply flow rate of the second halogen-based precursor is gradually increased within the cycle.

12. The method of claim 10, wherein at least one of the supply flow rate of the first halogen-based precursor and the supply flow rate of the second halogen-based precursor is gradually decreased within the cycle.

13. The method of claim 1, wherein at least one of the first halogen-based precursor, the second halogen-based precursor, and the reactant is continuously supplied in the cycle, wherein the second halogen-based precursor is different from the first halogen-based precursor.

14. The method of claim 13, wherein one of the first halogen-based precursor and the second halogen-based precursor is continuously supplied, and the reactant is intermittently supplied, in the cycle.

15. The method of claim 13, wherein each of the first halogen-based precursor and the second halogen-based precursor is intermittently supplied, and the reactant is continuously supplied, in the cycle.

16. The method of claim 1, wherein the cycle is performed in a state in which the substrate is accommodated in a process chamber, and
wherein the first halogen-based precursor and the second halogen-based precursor are mixed and then supplied into the process chamber in the supplying of the first halogen-based precursor and the supplying of the second halogen-based precursor.

17. The method of claim 1, wherein a duration of the supplying of the first halogen-based precursor to the substrate is gradually lengthened from a first time through the cycle to the predetermined number of times through the cycle.

18. A substrate processing apparatus, comprising:
a process chamber configured to accommodate a substrate;
a first supply system configured to supply a first halogen-based precursor and a second halogen-based precursor to the substrate in the process chamber, wherein the first halogen-based precursor and the second halogen-based precursor have same major elements and different halogen elements;
a second supply system configured to supply a reactant to the substrate in the process chamber, wherein the reactant has a chemical structure different from the first halogen-based precursor and the second halogen-based precursor; and
a controller configured to control the first supply system and the second supply system so as to form a film on the substrate in the process chamber by performing a cycle a predetermined number of times, the cycle including:
supplying the first halogen-based precursor to the substrate in a non-plasma atmosphere;
supplying the second halogen-based precursor to the substrate in the non-plasma atmosphere; and
supplying the reactant to the substrate in the non-plasma atmosphere.

19. A non-transitory computer-readable recording medium storing a program that causes a computer to perform a process of forming a film on a substrate by performing a cycle a predetermined number of times, the cycle including:
supplying a first halogen-based precursor to the substrate in a non-plasma atmosphere;
supplying a second halogen-based precursor to the substrate in the non-plasma atmosphere, wherein the first halogen-based precursor and second halogen-based precursor have same major elements and different halogen elements; and
supplying a reactant to the substrate in the non-plasma atmosphere, wherein the reactant has a chemical structure different from chemical structures of the first halogen-based precursor and the second halogen-based precursor.

20. A supply system, comprising:
a first supply system configured to supply a first halogen-based precursor and a second halogen-based precursor to a substrate, wherein the first halogen-based precursor and the second halogen-based precursor have same major elements and different halogen elements; and
a second supply system configured to supply a reactant to the substrate, wherein the reactant has a chemical structure different from chemical structures of the first halogen-based precursor and the second halogen-based precursor,
wherein the supply system is controlled to form a film on the substrate by performing a cycle a predetermined number of times, the cycle including:
supplying, using the first supply system, the first halogen-based precursor to the substrate in a non-plasma atmosphere;
supplying, using the first supply system, the second halogen-based precursor to the substrate in the non-plasma atmosphere; and
supplying, using second first supply system, the reactant to the substrate in the non-plasma atmosphere.

* * * * *